United States Patent
Hanks et al.

(10) Patent No.: US 10,432,248 B1
(45) Date of Patent: Oct. 1, 2019

(54) RF METROLOGY SYSTEM FOR A SUBSTRATE PROCESSING APPARATUS INCORPORATING RF SENSORS WITH CORRESPONDING LOCK-IN AMPLIFIERS

(71) Applicant: Lam Research Corporation, Fremont, CA (US)

(72) Inventors: Ernest Beauel Hanks, Santa Clara, CA (US); John Valcore, Jr., Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/922,172

(22) Filed: Mar. 15, 2018

(51) Int. Cl.
| | |
|---|---|
| *H04B 1/44* | (2006.01) |
| *H04B 1/10* | (2006.01) |
| *H03F 1/02* | (2006.01) |
| *H04B 1/00* | (2006.01) |
| *G06F 1/02* | (2006.01) |
| *H03F 1/30* | (2006.01) |

(52) U.S. Cl.
CPC .............. *H04B 1/44* (2013.01); *G06F 1/022* (2013.01); *H03F 1/0244* (2013.01); *H03F 1/306* (2013.01); *H04B 1/0075* (2013.01); *H04B 1/1018* (2013.01); *H03F 2200/481* (2013.01)

(58) Field of Classification Search
CPC ...... H04B 1/44; H04B 1/0075; H04B 1/1018; G06F 1/022; H03F 1/0244; H03F 1/306; H03F 2200/481
See application file for complete search history.

(56) References Cited

U.S. PATENT DOCUMENTS

| | | | |
|---|---|---|---|
| 6,332,961 B1 | 12/2001 | Johnson et al. | |
| 9,805,919 B1* | 10/2017 | Hanks | H01J 37/32935 |
| 2014/0345802 A1* | 11/2014 | Umehara | H05H 1/46 |
| | | | 156/345.28 |
| 2015/0002018 A1 | 1/2015 | Lill et al. | |
| 2015/0289355 A1 | 10/2015 | Hayano et al. | |
| 2016/0118227 A1 | 4/2016 | Valcore, Jr. et al. | |
| 2018/0342375 A1* | 11/2018 | Nguyen | H01J 37/32091 |

OTHER PUBLICATIONS

Bridge Circuits by Jim Williams, Linear Technology AN-43 pp. 32-34, published Jun. 1990: http://cds.linear.com/docs/en/application-note/an43f.pdf.

(Continued)

*Primary Examiner* — Nguyen T Vo

(57) ABSTRACT

A RF control circuit is provided and includes a controller, a divider, and a RF sensor. The controller selects a RF, which is a frequency of a reference LO signal. The divider receives a first RF signal detected in a substrate processing chamber and outputs a second RF signal. The first RF signal is generated by a RF generator and supplied to the substrate processing chamber. The RF sensor includes a lock-in amplifier, which includes: a RF path that receives the second RF signal; a LO path that receives the reference LO signal; a first mixer that generates an IF signal based on the second RF signal and the reference LO signal; and a filter that filters the IF signal. The controller generates a control signal based on the filtered IF signal and transmits the control signal to the RF generator to adjust the first RF signal.

20 Claims, 17 Drawing Sheets

(56) References Cited

OTHER PUBLICATIONS

"Novel Techniques of RF High Power Measurement" by Ovidiu D. Stan, EE PhD Dissertation Defense, 2007. https://www.engr.colostate.edu/ece/graduate_exams/grad_exams/Ovidiu_presentation.pdf.
"Square Law and Linear Detection" Application Note 986 Agilent Technologies, © 1981. Hewlett-Packard Co. http://www.hp.woodshot.com/hprfhelp/4_downld/lit/diodelit/an986.pdf.
"Schottky Barrier Diode Video Detectors" Application Note 923 Agilent Technologies / Hewlett Packard, Revision date Nov. 1999. http://cp.literature.agilent.com/litweb/pdf/5954-2079.pdf.
"Op Amp Rectifiers, Peak Detectors and Clamps" Application Note 1353 by Dragos Ducu, © 2011 Microchip Technology Inc. http://ww1.microchip.com/downloads/en/AppNotes/01353A.pdf.
"An Improved Peak Detector" Application Note 1097 Intersil by Tamara I. Ahrens, Mar. 23, 1998. http://www.intersil.com/content/dam/intersil/documents/an10/an1097.pdf.
"Diode Detectors for RF Measurement" by David W Knight. © D.W. Knight, 2005-2008. 2013-2016. http://www.g3ynh.info/circuits/Diode_det.pdf.
"About Lock-In Amplifiers" Application Note #3 by Stanford Research Systems, 2018. http://www.thinksrs.com/downloads/PDFs/ApplicationNotes/AboutLIAs.pdf.
International Search Report and Written Opinion regarding PCT/US2019/020949, dated Jun. 14, 2019, 7 pages.

\* cited by examiner

RF METROLOGY SYSTEM FOR A SUBSTRATE PROCESSING APPARATUS INCORPORATING RF SENSORS WITH CORRESPONDING LOCK-IN AMPLIFIERS

RELATED APPLICATION

The application is related to U.S. Pat. No. 9,805,919. The entire disclosure of U.S. Pat. No. 9,805,919 is incorporated herein by reference.

FIELD

The present disclosure relates to radio frequency detectors.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Ionized gas, or plasma, is commonly used during the processing and fabrication of semiconductor devices. For example, plasma can be used to etch or remove material from a substrate such as a semiconductor wafer, and to sputter or deposit material onto the substrate. Creating plasma for use in manufacturing or fabrication processes typically begins by introducing process gases into a processing chamber. The substrate is disposed in the processing chamber on a substrate support such as an electrostatic chuck or a pedestal.

The processing chamber may include a transformer coupled plasma (TCP) coil. A radio frequency (RF) signal, supplied by a power supply, is supplied to the TCP coil. A dielectric window, constructed of a material such as ceramic, is incorporated into an upper surface of the processing chamber. The dielectric window allows the RF signal from the TCP coil to be transmitted into the interior of the processing chamber. The RF signal excites gas molecules within the processing chamber to generate plasma.

A bias RF power source supplies a biasing RF signal to the substrate support. The biasing RF signal can be used to increase the direct current (DC) bias and/or a DC sheath potential to increase the energy with which the charged particles strike the substrate. Variations in the biasing RF signal produce corresponding variations in the DC bias and/or DC sheath potential at the substrate affecting the process characteristics.

A pickup device may be attached to the substrate support and is used to detect an RF input signal at the substrate support. A RF detector is connected to the pickup device and detects the RF input signal. The biasing RF signal may be adjusted based on the detected RF input signal, for example, to minimize variations in the DC bias and/or the DC sheath potential at the substrate.

SUMMARY

A RF control circuit is provided and includes a controller, a divider, and a first RF sensor. The controller is configured to select a reference frequency. The reference frequency is a frequency of a first reference local oscillator (LO) signal. The divider is configured to receive a first RF signal detected in a substrate processing chamber and divide the first RF signal to output a second RF signal. The first RF signal is generated by a first RF generator and supplied to the substrate processing chamber. The first RF sensor includes a lock-in amplifier. The lock-in amplifier includes: a RF path configured to receive the second RF signal; a LO path configured to receive the first reference LO signal generated by the first RF generator or the controller; a first mixer configured to generate a first intermediate frequency (IF) signal based on the second RF signal and the first reference LO signal; and a filter configured to filter the first IF signal. The controller is configured to generate a control signal based on the filtered first IF signal and transmit the control signal to the first RF generator to adjust the first RF signal.

In other features, a sine-to-square wave converter is included and is configured to convert a sine wave of the second RF signal to a square wave. In other features, a current amplifier is included and is configured to amplify an output of the sine-to-square wave converter. The output of the sine-to-square wave converter is provided to the first mixer.

In other features, the reference frequency is a harmonic of a frequency of the first RF signal or is an intermodulation frequency corresponding to the first RF signal. In other features, the LO path is configured to receive the first reference LO signal from the first RF generator or the controller. In other features, the first RF signal is detected at least one of at an output of a match network or at a point within the substrate processing chamber. In other features, the first RF generator is configured to generate the first reference LO signal. In other features, the controller is configured to generate the first reference LO signal.

In other features, the first RF generator or the controller is configured to sweep a phase of the first reference LO signal until a maximum or a minimum is reached. The maximum is a maximum voltage of the first RF signal or a maximum phase error between a phase of the first RF signal and a phase of the first reference LO signal. The minimum is a minimum voltage of the first RF signal or a minimum phase error between a phase of the first RF signal and a phase of the first reference LO signal.

In other features, a processing system is provided and includes the RF control circuit and a match network. The controller includes a first channel, a second channel and a third channel. The first channel outputs a third RF signal. The second channel outputs a fourth RF signal. The third channel outputs the first reference LO signal to the first RF sensor. The RF generator includes a first power amplifier and a second power amplifier. The first power amplifier is configured to generate the first RF signal based on the third RF signal. The second power amplifier is configured to generate a fifth RF signal based on the fourth RF signal. The match network is configured to receive the first RF signal and the fifth RF signal.

In other features, a processing system is provided and includes the RF control circuit and a match network. The match network is configured to receive the first RF signal. The first RF generator includes a first channel and a second channel. The first RF signal is generated based on an output of the first channel. The second channel is configured to output the first reference LO signal. The first RF sensors includes: a second mixer configured to generate a second IF signal based on an output of the match network, where the first mixer is configured to generate the first IF signal based on the first reference LO signal, and a phase shifter configured to phase shift the first reference LO signal. The second mixer is configured to generate the second IF signal based on the phase shifted first reference LO signal. An output of the first RF sensor is generated based on the second IF signal. The controller at least one of generates the control signal or controls the first RF generator based on the output of the first RF sensor.

In other features, a processing system is provided and includes the RF control circuit and the first RF generator. The first RF generator is configured to, based on a RF of the first RF signal, output the first reference LO signal. In other features, the first RF generator includes channels including a first channel and a second channel. The first RF signal is generated based on an output of the first channel. The first reference LO signal is generated based on an output of the second channel. In other features, the first RF generator is configured to generate the first RF signal and the first reference LO signal based on a reference clock signal. In other features, the channels include a third channel. The third channel is configured to output a third RF signal for the substrate processing chamber. The first RF generator is configured to generate the first RF signal and the third RF signal based on a reference clock signal.

In other features, the first RF generator outputs the first RF signal and a fourth RF signal to a match network. The fourth RF signal is generated based on the third RF signal. In other features, the processing system further includes a match network and a second RF generator, which is configured to generate a third RF signal. The match network is configured to receive the first RF signal and the third RF signal.

In other features, the first RF generator is configured to generate the first RF signal based on a reference clock signal. The second RF generator is configured to generate the third RF signal based on the reference clock signal. In other features, a phase synchronization signal is transmitted between the first RF generator and the second RF generator. The first RF generator adjusts a phase of the first RF signal based on the phase synchronization signal or the second RF generator adjusts a phase of the third RF signal based on the phase synchronization signal.

In other features, the processing system further includes a switch or a multiplexer, where: the second RF generator is configured to output a second reference LO signal; the controller is configured to control operation of the switch or multiplexer to select one of the first reference LO signal and the second reference LO signal; and the LO path is configured to receive the selected one of the first reference LO signal and the second reference LO signal. In other features, the processing system further includes a second RF sensor, where: the second RF generator is configured to output a second reference LO signal; and the second RF sensor is configured to receive the second RF signal and the second reference LO signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
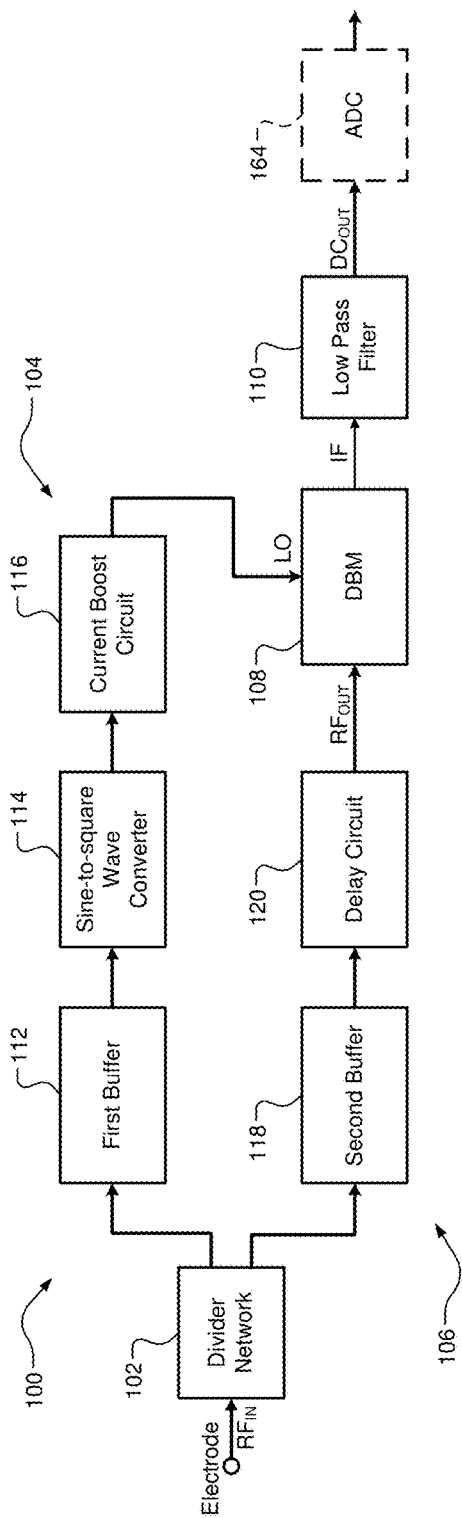
FIG. 1 is a functional block diagram of an example of a RF root mean square (RMS) detection circuit including a current boost circuit.

High-voltage and high-current RF measurements may be taken at various points in or outside of a processing chamber. As an example, the RF measurements may be taken via RF electrodes in a substrate support. The RF measurements may be used for diagnostic purposes and/or for closed-loop feedback control. Examples of RF detectors that may be used to take the RF measurements are a voltage-current (VI) probe and a voltage control interface (VCI) probe. The RF detectors may be used on tools, within RF match circuits and RF generators, and as part of processing system circuits.

RF detectors are used in telecom, defense, and other electronic industry applications. The RF detectors are typically configured for certain dynamic ranges, accuracy levels, transient responses, etc. RF detectors that are designed to have a high dynamic range often exhibit significant errors. Logarithmic (nonlinear) RF detectors, for example, may have a dynamic range of 10,000:1 (80 dB), meaning the received RF voltage may vary, for example, between 10,000 volts and 1 volt. However, the logarithmic RF detectors may only be accurate to approximately 5-10% over the dynamic range. In certain high-voltage and high-current applications, accuracy of better than or equal to ±1% (or linear error of ±1%) is required. This improved accuracy is needed while maintaining a high dynamic range. These accuracy and range requirements are applicable in plasma etching environments.

Requirements of RF detectors can be split into primary requirements and secondary requirements. The primary requirements are determined by design and architecture and are typically the first (or primary) performance indicators of interest. The secondary requirements refer to other relevant requirements that are of less interest, but may be satisfied based on the design of the corresponding RF detector.

Examples of primary requirements include dynamic range, accuracy and linearity. Dynamic range refers to a measurement range of a RF detector (e.g. a 1-10V RF detector, a 1-10,000V RF detector, etc.). A dynamic range may be expressed in a simplified form based on a greatest common factor. For example, a 10:1 (or 20 db) dynamic range is equivalent to dynamic ranges of 1-10V, 2-20V, 10-100V, etc. The dynamic range having the simplified ratio is often referred to as a spurious-free radio frequency dynamic range (SFDR). The dynamic range of a RF detector includes a high-end and a low-end. A well designed RF detector has a low-end that is limited by circuit functionality and system and/or component noise limits. The high-end of a RF detector may be limited by linearity errors, which can introduce spurs or nonlinearity when the linearity error is above a predetermined threshold. Traditional 1% high voltage RF detectors have a dynamic range of 40:1 (32 dB). At least some examples disclosed herein provide, for example, a dynamic range of 1500:1 (63 dB) or better, while maintaining 1% accuracy.

The primary requirement of "accuracy" refers to an amount of error of a RF detector over a dynamic range of the RF detector. Fundamentally, "accuracy" is analogous to "linearity" in a linear RF detector since offset and gain may be easily calibrated and/or adjusted. An example accuracy level is +/−1% error. At least some of the examples disclosed herein provide an accuracy level of +/−1% or better. Linearity is a measure of the differences between changes in actual RF values and corresponding changes in detected RF values. Linearity may refer to differences between (i) a curve provided by plotting the actual RF values versus the detected RF values, and (ii) a linear line.

Examples of secondary requirements are signal flatness over a frequency bandwidth, transient response, temperature stability, within-unit repeatability, and unit-to-unit repeatability. Signal flatness over a frequency bandwidth refers to having an output voltage change of less than a predetermined threshold over a range of operating frequencies of, for example, a RF generator. An RF generator may have different and/or large tuning ranges and manufactured RF detectors need to be designed appropriately for these different tuning ranges. This assures that a change in an output voltage (or current) of a RF detector is due to a voltage (or current) change in a RF input signal and not due to a change in frequency of the RF input signal. If the output of the RF detector changed due to frequency, then another source of error is effectively introduced. A transient response refers to how quickly a RF detector changes in response to a change in a RF input signal. A transient response of a RF detector typically needs to be quick enough to react to RF pulsing.

FIG. 1 shows a RF RMS detection circuit 100, which includes a self-locking lock-in amplifier. Although, the RF RMS detection circuit 100 provides accurate and linear RF detection and has a high dynamic range, the RF RMS detection circuit 100 is configured to effectively measure only a fundamental frequency of interest. Additional channels are needed to measure other frequencies.

The RF RMS detection circuit 100 includes a divider network 102, a local oscillator (LO) path 104, a RF path 106, a DBM 108 and a low pass filter 110. The LO path 104 may include a first buffer 112, a sine-to-square wave converter 114, and a current boost circuit 116. The RF path 106 may include a second buffer 118 and a delay circuit 120.

The divider network 102 may include one or more dividers and receives a RF input signal RFIN. Each of the dividers may include two or more resistors, capacitors, coils, and/or other divider circuit elements. As an example, a pair of resistors may be connected in series. An RF input signal RFIN may be provided across the resistors and a lower RF voltage may be detected at a terminal between the resistors. Similarly, a pair of capacitors may be connected in series and receive the RF input signal RFIN and provide a lower RF voltage at a terminal between the capacitors.

High-voltage and high-current RF detectors often include one or more dividers that receive a RF input signal RFIN and divide down the RF input signal RFIN from a large voltage/current signal to a small voltage/current signal to be handled by electronic circuits downstream of the divider. The dividers may be resistor, capacitor, and/or coil based. For example a 1000:1 divider could convert 1000V to 1V. The divider ratio does not refer to the dynamic range of the RF sensor. The dividers set the scaling of the corresponding RF detector. For example, a RF sensor having a 1500:1 dynamic input range can have a voltage input range of 1-1500V, 2-3000V, 10-15000V depending on the divider(s) used. Dynamic range and accuracy of a RF detector is typically not associated with a divider, but rather is associated with the electronic circuits downstream from the divider.

The divider network 102 may include one or more dividers for attaining RF signals with different amplitudes for the LO and RF paths 102, 104. As an example, the divider network 102 may output a first RF signal to the LO path 104 that has a greater amplitude than a second RF signal output to the RF path 106.

The buffers 112, 118 may be analog amplifier buffers and include respective operational amplifiers and buffer the outputs of the divider network 102. The first buffer 112 may have a same delay as the second buffer 118. The sine-to-square wave converter 114 converts a sine wave received from the first buffer 112 to a square wave. The sine-to-square wave converter 114 may be implemented as a limiter and may include or be implemented as, for example, a limiter or a high-speed comparator. As an example, the high-speed comparator may compare a received RF signal to a reference threshold. An output of the high-speed comparator may transition HIGH when the amplitude of the RF signal exceeds the reference threshold. The output may transition LOW when the RF signal is below the reference threshold.

Figure 15:
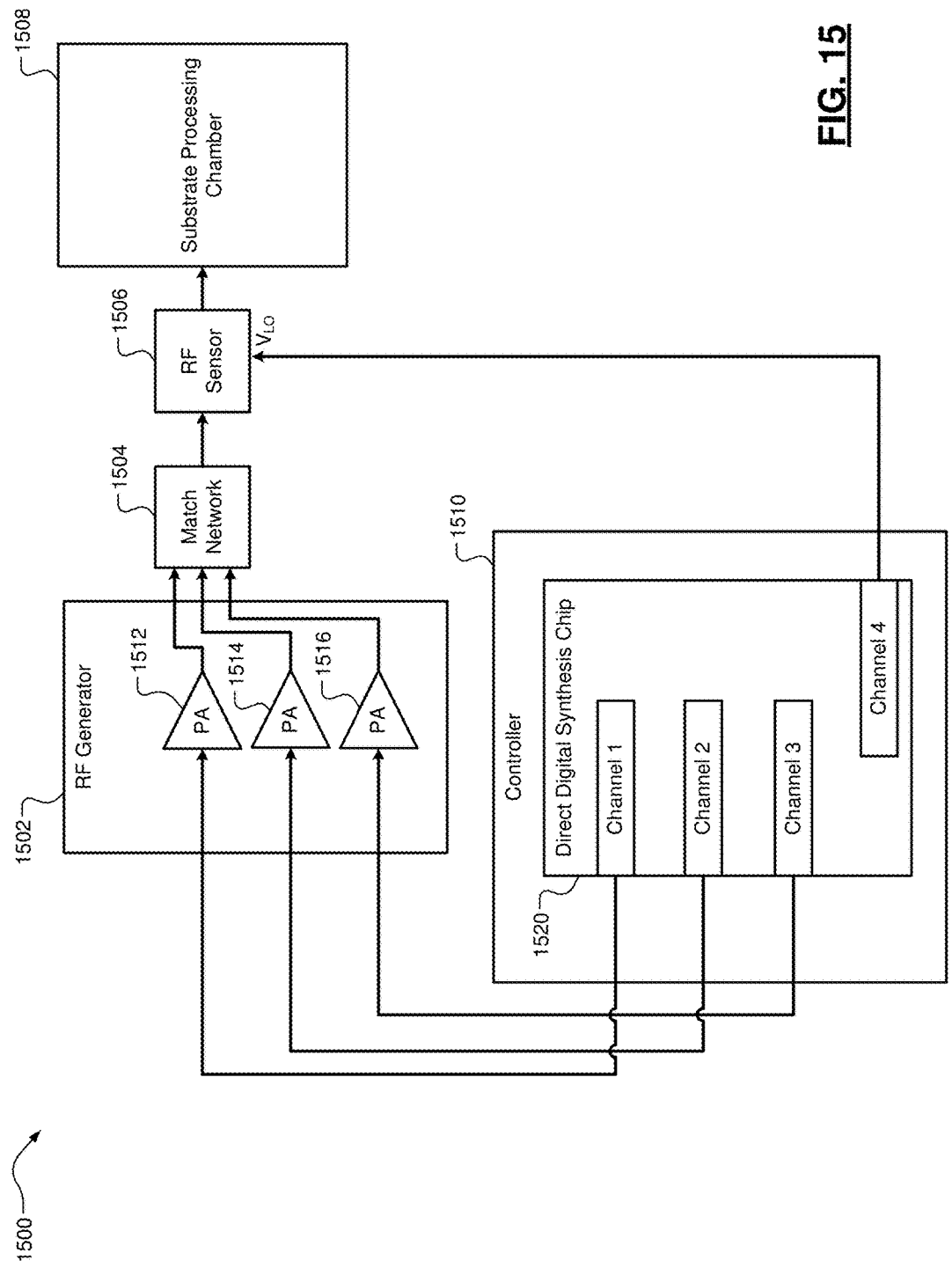
FIG. 15 is a functional block diagram of an example of a RF processing circuit illustrating controller based generation of RF signals and a reference local oscillator signal in accordance with an embodiment of the present disclosure.

The current boost circuit 116 increases a current level of the square wave signal output of the sine-to-square wave converter 114. This increases strength of the square wave signal. The current boost circuit 116 may be implemented as a low voltage differential signaling (LVDS)-to-transistor-to-transistor logic (TTL) converter. The output of the current boost circuit 116 is a local oscillator signal LO, which is provided to the DBM 108. An example of the current boost circuit 116 is shown in FIG. 15.

The delay circuit 120 delays an output of the second buffer 118. The output of the delay circuit is a RF output signal $RF_{OUT}$. The delay of the delay circuit 120 is equal to a sum of delays caused by the sine-to-square wave converter 114 and the current boost circuit 116. This assures that the outputs of the buffers 112, 118, which are represented by the signals LO, $RF_{OUT}$, are received at the DBM at the same time. In other words, the signals LO, $RF_{OUT}$ are in-phase with one another. In one embodiment, the signals LO, $RF_{OUT}$ are 180° out-of-phase.

The DBM 108 provides a wide dynamic range and linearity. As an alternative to the DBM 108, a linear multiplier may be used. The DBM 108 is operated in a saturated mode. The saturated mode occurs when driving the signal LO with a stronger (higher current level) than the signal $RF_{OUT}$. The DBM 108 is not used as a phase detector. The DBM 108 is used to create a direct current (DC) output, which is representative of the signal $RF_{OUT}$. The DBM 108 outputs an intermediate frequency signal IF, which is filtered by the low pass filter 110. The signal IF is a half-wave rectified version of the signal $RF_{OUT}$. The low pass filter 110 filters the signal IF to remove high-order frequency components and provide a DC output signal $DC_{OUT}$. An analog-to-digital converter (ADC) may be added and averaging and/or digital signal processing may be performed to improve resolution. As an example, an ADC 164 is shown.

RF pulse performance of an output of the RF RMS detection circuit 100 is based on operation of the low pass filter 110. RF pulse performance of the RF RMS detection circuit 100 is improved over analog-based RF detectors that include operational amplifiers and diodes because there is no waiting for amplifiers to stabilize diode operating points. In one embodiment, the low pass filter 110 is are replaced with a bandpass filter for selective RF frequency operation.

RF diodes exhibit nonlinearity with small amplitude signals, analogous to the issues that limit dynamic ranges of traditional high voltage RF VI probes. When the amplitudes are too small, the RF diodes are completely turned OFF. As the amplitudes increase, the RF diodes start to conduct and enter a nonlinear region, but do not operate as ideal switches. Although some RF detectors take advantage of this nonlinear region of operation, since power is effectively being measured and not voltage amplitude, significant mathematical processing is required and secondary difficulties of handling the non-linear to linear transition can occur. For large amplitude signals, the RF diodes are fully ON and operate as linear RF detectors.

A diode bridge ring (e.g., such as that provided by a Schottky diode ring) compensates for nonlinearities in RF diodes since the diode bridge ring balances nonlinearities amongst two branches. The DBM 108 may include a diode bridge ring, as further described below.

The DBM 108 includes 3 terminals; a first input terminal that receives signal LO, a second input terminal that receives signal $RF_{OUT}$, and an output terminal that outputs signal IF. The signal IF may be represented by equation 1 when the DBM has a saturated LO path (i.e., when $V_{LO} \gg V_{RF}$), where $V_{LO}$, $\omega_{LO}$ and $\phi_{LO}$ are the voltage, frequency and phase of signal LO, where $V_{RF}$, $\omega_{RF}$, $\phi_{RF}$ are the voltage, frequency and phase of signal RF, and where $V_{IF}$ is the voltage of signal IF.

$$V_{IF} = \left(\frac{1}{2} V_{RF} V_{LO} \cos[(\omega_{LO} - \omega_{RF})t - (\phi_{LO} - \phi_{RF})]\right) + \left(\frac{1}{2} V_{RF} V_{LO} \cos[(\omega_{LO} + \omega_{RF})t + (\phi_{LO} - \phi_{RF})]\right) + HigherOrderTerms \quad (1)$$

In theory, a linear measurement of RF amplitude may be taken using the following rules: 1) fixing $V_{LO}$ to a fixed amplitude by driving the signal LO with a square wave; 2) making $V_{LO}$ a square wave of a same frequency as $\omega_{RF}$, such that the $(\omega_{LO} - \omega_{RF})t$ term cancels; and 3) keeping the $\Delta\phi = (\phi_{LO} - \phi_{RF})$ as small as possible (e.g., at 0°), as close to 180° as possible, or as close to an integer multiple of 180°. With these rules applied, equation 1 may be simplified to equation 2

$$V_{IF} = \left(\frac{1}{2} V_{RF} V_{LO}\right) + \left(\frac{1}{2} V_{RF} V_{LO}\right) \cdot (\cos 2\omega t) + HigherOrderTerms \quad (2)$$

When followed with a filter, such as a low pass filter or a band pass filter, equation 2 may be simplified to equation 3.

$$V_{IF} = \left(\frac{1}{2} V_{RF} V_{LO}\right) + HigherOrderTerms \quad (3)$$

Hence with a fixed amplitude $V_{LO}$, a linear measurement of the amplitude of $V_{RF}$ is achieved. The higher order terms have minimal effect on linearity. For example, the effect of higher order terms on linearity is negligible for dynamic ranges equal to or smaller than 1500:1.

A saturated LO path causes a DBM to operate as a phase detector exhibiting output voltage variation as a function of a phase difference between signals RF and LO. This means a phase difference between signals RF and LO yields an output voltage error that reduces RF detector accuracy. Since the above-described equations depend on cos ($\Delta\phi$), by having $\Delta\phi$ equal to 0°, 180°, or a multiple of 180° phase immunity is improved. Although phase shift should only be a static gain error (hence easily calibrated out), secondary drifts can result in more error. Hence, the RF RMS detectors described herein are configured and operated, such that $\Delta\phi$ is equal or within a predetermined range of 0°, 180°, or an integer multiple of 180°. Delay circuits, amplifiers, drivers, sine-to-square wave converters, and other circuit elements are provided, such that $\Delta\phi$ is equal to 0°, 180°, or an integer multiple of 180°.

High-end dynamic range may be based on inputs of the DBM 108 including component maximum, nonlinear spurs, crosstalk, and drive-strength between LO and RF ports of the DBM 108. If the signal $RF_{OUT}$ is too large, the LO square wave is not strong enough to put the DBM 108 into the saturated mode. In addition, sine-to-square wave converters (e.g., limiters) may degrade in performance as a drive current of the sine-to-square wave converters increases. Providing a current gain in the LO path is beneficial for a high-end range by providing additional LO drive strength. The current gain in the LO path also minimizes low-end limiter noise and potentially increases low-end range. To improve strength of the LO square wave, the current boost circuit 116 is included. The current boost circuit 116 may be implemented as a LVDS-to-TTL driver, high-speed analog comparators, digital drivers, and/or current boosting logic chips. A high-end dynamic range may be provided via a double-balanced mixer with additional diodes legs of a bridge ring. This may require more LO drive strength, but operate with a higher input signal range.

The DBM 108 may be implemented as shown or may be replaced with a linear mixer, and/or other LO/RF-to-IF conversion circuits. The LO/RF-to-IF conversion circuits may include double balanced mixers of various power levels, mixers with additional diodes in legs of the mixers, diode arrays, linear multipliers, FET mixers, transistor arrays, and analog/FET switches.

Figure 2:
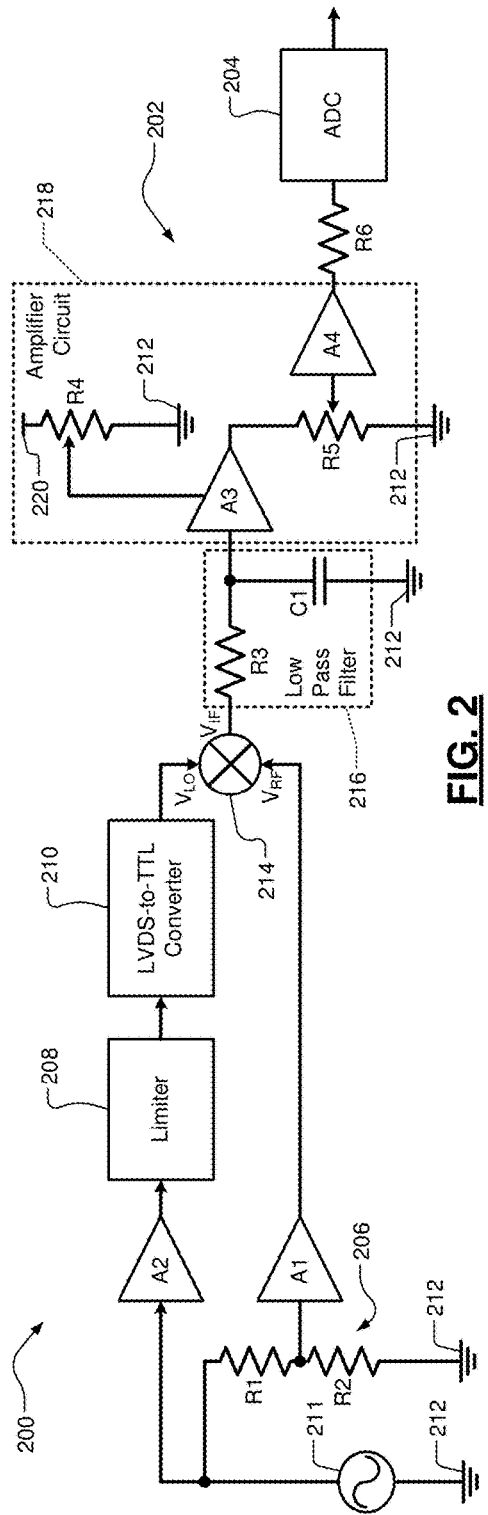
FIG. 2 is a functional block and schematic diagram of a RF RMS detection circuit incorporating a self-locking lock-in amplifier.

FIG. 2 shows a RF RMS detection circuit 200 including a self-locking lock-in amplifier 202 and an analog-to-digital converter (ADC) 204. The self-locking lock-in amplifier 202 includes (i) an RF path with a voltage divider 206 and a first buffer A1, and (ii) a LO path with a second buffer A2, a limiter 208 and a LVDS-to-TTL converter 210. The voltage divider 206 includes resistors R1, R2, which are connected in series between a RF source 211 (e.g., an RF electrode in a substrate processor chamber, such as electrode 342 in FIG. 3) and a ground reference terminal 212. The first buffer A1 receives an output of the voltage divider 206 and provides a RF voltage signal $V_{RF}$ to a DBM 214, which is similar to the DBM 108 of FIG. 1. The buffer A2 receives the RF signal from the RF source 211. An output of the buffer A2 is provided to the limiter 208 (e.g., a sine-to-square wave converter). An output of the limiter 208 is provided to the LVDS-to-TTL converter 210 (e.g., a current boost circuit). A LO voltage signal $V_{LO}$ from the LVDS-to-TTL converter 210 is provided to the DBM 214.

The DBM 214 generates an intermediate frequency signal $V_{IF}$, which is provided to a low pass filter 216, which includes a resistor R3 and a capacitor C1. A filtered signal out of the low pass filter 216 is provided to an amplifier circuit 218, which includes (i) a first amplifier A3 with a calibratable offset resistor R4, and (ii) a second amplifier A4 with a calibratable gain resistor R5. The resistor R4 is connected between a voltage supply terminal 220 and the ground reference terminal 212. The offset and the gain of the amplifier circuit 218 may be adjusted by adjusting resistances of R4 and R5. An output of the amplifier circuit 218 is provided to a resistor R6, which is connected to an input of the ADC 204. The ADC 204 converts the analog output of R6 to a digital signal. The digital signal may be provided to a controller, such as the controller 346 of FIG. 3.

The examples set forth herein include RF control circuits that each includes one or more RF sensors with corresponding lock-in amplifiers. The lock-in amplifiers include at least two inputs; one of the inputs is a received RF signal and at least one of the other inputs is a local oscillator signal provided by a RF generator, a controller or an intermediary device. One or more intermediary devices may exist (i) between an RF generator and a RF sensor, or (ii) between a controller and a RF sensor. The examples disclosed herein include RF control circuits and methods for RF metrology that achieve high-dynamic range, excellent linearity, and the ability to measure/characterize RF signals of different frequencies. Measurement of these RF signals may be used in substrate processing, such as during etching, deposition, cleaning, and/or other substrate processes. The measurements may be used as driving factors for uniformity, etch rate, etc. from both a metrology and closed-loop control perspective. The RF sensors disclosed herein may be used, for example, in conductor etch voltage current (VI) probes, in conductor etch voltage control interfaces (VCIs), and/or as dielectric VI sensors.

Figure 3:
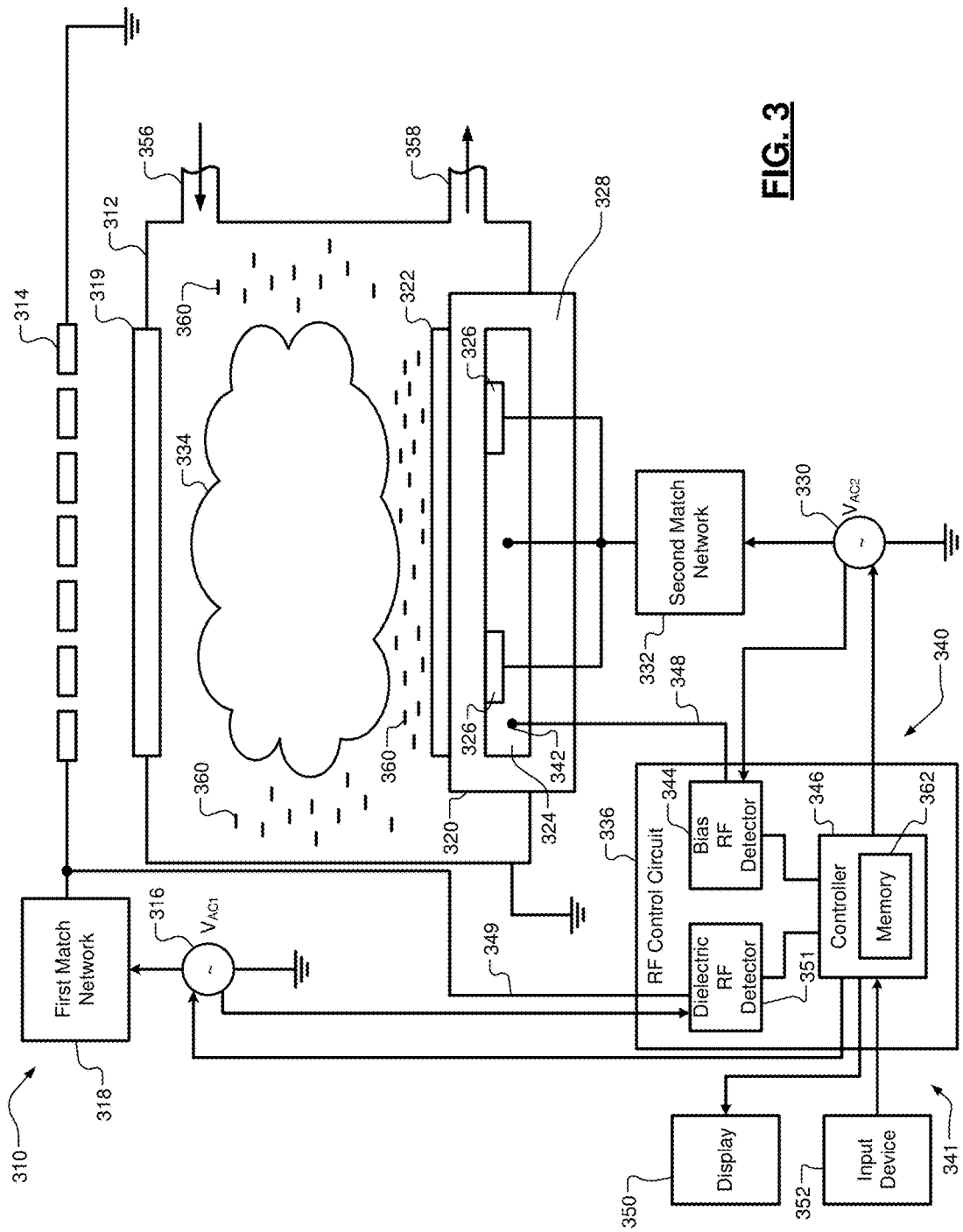
FIG. 3 is a functional block diagram of an example of a plasma processing system incorporating RF RMS detection circuits in accordance with the present disclosure.

FIG. 3 shows a plasma processing system 310 that includes a substrate processing chamber 312 and a transformer coupled plasma (TCP) coil 314. The TCP coil 314 is disposed outside and above the substrate processing chamber 312. The first power source 316 provides a first RF source signal. A first match network 318 is included between the first power source 316 and the TCP coil 314. The substrate processing chamber 312 includes a ceramic window 319, which is located adjacent the TCP coil 314 and allows efficient transmission of the first RF source signal into the substrate processing chamber 312 for plasma generation purposes.

The plasma processing system 310 further includes a substrate support 320 such as an electrostatic chuck, a pedestal or other suitable substrate support, located at the bottom of the substrate processing chamber 312. The substrate support 320 supports a substrate 322, which is processed in the plasma (or substrate) processing system 310. If the substrate support 320 is an electrostatic chuck, the substrate support 320 includes electrically conductive portions 324 and 326, which are electrically isolated from each other. The substrate support 320 is surrounded by an insulator 328 and is capacitively coupled to the substrate 322. By applying a DC voltage across the conductive portions 324, 326, an electrostatic coupling is created between the conductive portions 324, 326 and the substrate 322. This electrostatic coupling attracts the substrate 322 against the substrate support 320.

The plasma processing system 310 further includes a bias RF power source 330, which is connected to a second match network 332. The second match network 332 is connected between the bias RF power source 330 and the substrate support 320. The second match network 332 matches an impedance (e.g., 50Ω) of the bias RF power source 330 to an impedance of the substrate support 320 and plasma 334 in the substrate processing chamber 312 as seen by the second match network 332.

The plasma processing system 310 is provided as an example implementation for RF detectors. The RF detectors disclosed herein may be used to detect voltages/current levels at other locations than shown in FIG. 1 and may be used in other processing systems.

The plasma processing system 310 further includes a RF control circuit 336 that has corresponding VCI 340, 341. The VCI 340 may include a pickup device (e.g., an electrode) 342, a bias RF detector 344 (also referred to as a RF sensor and includes a RF RMS detection circuit), a controller 346 and any circuitry between the bias RF detector 344 and the controller 346. The pickup device 342 extends into the substrate support 320. The pickup device 342 is connected via a wire 348 to the bias RF detector 344 and is used to generate a first RF input signal. The bias RF detector 344 is configured to detect voltages and/or current levels in the first RF input signal. The VCI 341 includes a signal line 349, a RF detector 351, and the controller 346 and any circuitry between the RF detector 351 and the controller 346. The signal line 349 may be connected to a supply line of the TCP coil 314 as shown or may be connected elsewhere and provides a second RF input signal. The RF detector is configured to detect voltages and/or current levels in the second RF input signal. The RF detectors 344, 351 may receive LO reference signals respectively from the RF power sources 316, 330 (also referred to as RF generators). The LO reference signals may have a same or similar frequency and/or phase as the RF signals provided by the RF power sources 316, 330 to the match networks 318, 332. Although a certain number of pickup devices, wires, and RF detectors are shown, any number of each may be included. Also, although the RF detectors 344, 351 are shown as detecting RF signals at certain locations, the RF detectors 344, 351 may be used to detect RF signals at other locations, such as out of the RF power sources 316, 330, out of the match networks 318, 332, in the substrate processing chamber 312, etc. Other examples are disclosed and described with respect to the embodiments of FIGS. 4-15.

The RF detectors 344, 351 generate output signals, which may be monitored and/or used to adjust biasing and RF signals generated by the RF power source 316, 330. Operations of the RF detectors 344, 351 may be monitored, manually controlled, and/or controlled via the controller 346. The controller 346 may receive and display output voltages and/or current levels of the RF detectors 344, 351 on a display 350. Although shown separate from the controller 346, the display 350 may be included in the controller 346. The controller 346 may receive input signals from an input device 352 and control operation of the RF detector 344 based on the input signals. Although shown separate from the controller 346, the input device 352 may be included in the controller 346. The controller 346 may control operation of the RF detectors 344, 351 based on the output signals of the RF detectors 344, 351. Examples and operation of the RF detectors 344, 351 are further described below with respect to FIGS. 4-15.

In operation, a gas capable of ionization flows into the substrate processing chamber 312 through the gas inlet 356 and exits the substrate processing chamber 312 through the gas outlet 358. The first RF signal is generated by the RF power source 316 and is delivered to the TCP coil 314. The first RF signal radiates from the TCP coil 314 through the window 319 and into the substrate processing chamber 312. This causes the gas within the substrate processing chamber 312 to ionize and form the plasma 334. The plasma 334 produces a sheath 360 along walls of the substrate processing chamber 312. The plasma 334 includes electrons and positively charged ions. The electrons, being much lighter than the positively charged ions, tend to migrate more readily, generating DC bias voltages and DC sheath potentials at inner surfaces of the substrate processing chamber 312. An average DC bias voltage and a DC sheath potential at the substrate 322 affects the energy with which the positively charged ions strike the substrate 322. This energy affects processing characteristics such as rates at which etching or deposition occurs.

The controller 346 may adjust the bias RF signal generated by the RF power source 330 to change the amount of DC bias and/or a DC sheath potential at the substrate 322. The controller 346 may compare outputs of the channels of the RF detector 344 and/or a representative value derived based on the outputs of the channels to one or more set point values. The set point values may be predetermined and stored in a memory 362 of the controller 346. The bias RF signal may be adjusted based on differences between (i) the outputs of the RF detector 344 and/or the representative value and (ii) the one more set point values. The bias RF signal passes through the second match network 332. An output provided by the second match network 332 (referred to as a matched signal) is then passed to the substrate support 320. The bias RF signal is passed to the substrate 322 through the insulator 328.

The examples set forth below describe RF sensors including lock-in amplifiers with RF inputs and reference LO inputs. The lock-in amplifiers are not self-locking amplifiers. Although self-locking amplifiers, such as that disclosed in U.S. Pat. No. 9,805,919, do not require programming of LO frequencies and/or phases and are able to accurately measure a single RF frequency, self-locking amplifiers are not able to monitor multiple frequencies of interest in the presence of other RF frequencies and noise. The non-self-locking amplifiers disclosed herein allow selection and monitoring of various frequencies, harmonics (e.g., $\omega_{RF}$, $2\omega_{RF}$, $3\omega_{RF}$, etc.), and intermodulation frequencies (e.g., $\omega_{RF1}\pm2\omega_{RF2}$, $\omega_{RF1}\pm3\omega_{RF2}$, $\omega_{RF2}\pm2\omega_{RF3}$, $\omega_{RF1}\pm2\omega_{RF3}$, etc.) in the presence of other frequencies and noise. This is advantageous due to process relationships between harmonics and intermodulation frequencies associated with plasma. As an example, a plasma processing system 310 may include one or more RF generators that generate RF signals (e.g., RF signal $\omega_{RF1}$=1 MHz and RF signal $\omega_{RF2}$=13.56 MHz) for a particular recipe. As another example, the plasma processing system 310 may include one or more RF generators that generate $\omega_{RF1}$=2 MHz, $\omega_{RF2}$=27 MHz and $\omega_{RF3}$=60 Mhz RF signals. Plasma in the plasma processing system 310 may have harmonic and intermod content based on the generated RF signals.

As an example, the RF sensors may achieve a 60-80 dB dynamic range with linear 1% accuracy and are applicable to RF pulsing systems. The corresponding RF control circuits are programmable and/or tunable to selected frequencies. The frequencies may be automatically selected via corresponding controllers and/or may be manually selected via an input device. By having a second input on a RF sensor and by using an external programmable clock, the disclosed system is able to tune to selected reference LO signal frequencies and phases.

As an example, assume a complicated signal is being measured in a plasma environment. In a multi-frequency system, such as a processing chamber with both a 1 MHz RF signal and a 13.56 MHz RF signal present, a RF signal detected in the processing chamber exhibits a complicated structure due to RF generator and plasma interactions, as shown by Table 1.

TABLE 1

| Frequency | Amplitude | Frequency Type |
| --- | --- | --- |
| 1 MHz | 1000 V | Fundamental |
| 2 MHz | 200 V | Harmonic |
| 3 MHz | 200 V | Harmonic |
| 4 MHz | 100 V | Harmonic |
| 5 MHz | 50 V | Harmonic |
| 13.56 MHz | 1000 V | Fundamental |
| 27.12 MHz | 100 V | Harmonic |
| 40.68 MHz | 50 V | Harmonic |
| 54.24 MHz | 20 V | Harmonic |
| 67.8 MHz | 10 V | Harmonic |
| 12.56 MHz | 50 V | Intermod |
| 14.56 MHz | 50 V | Intermod |

TABLE 1-continued

| Frequency | Amplitude | Frequency Type |
|---|---|---|
| 11.56 MHz | 200 V | Intermod |
| 15.56 MHz | 200 V | Intermod |

The disclosed RF control circuits including RF sensors with non-self-locking lock-in amplifiers allow, for etching purposes, to selectively measure and/or perform closed loop control based on correlations between (i) frequencies/phases/amplitudes and (ii) etching performance (e.g. uniformity, etch-rate, etc.). For closed-loop control, the RF control circuits may be tuned to minimize voltage at a particular frequency (e.g., 5 MHz) by adjusting RF generator set points, match network impedances, etc. These adjustments may be done automatically or manually. The disclosed RF control circuits are able to measure the particular frequency component of interest accurately and independently when the detected signal coming from the processing chamber is a composition of signals at frequencies in Table 1.

Figure 4:
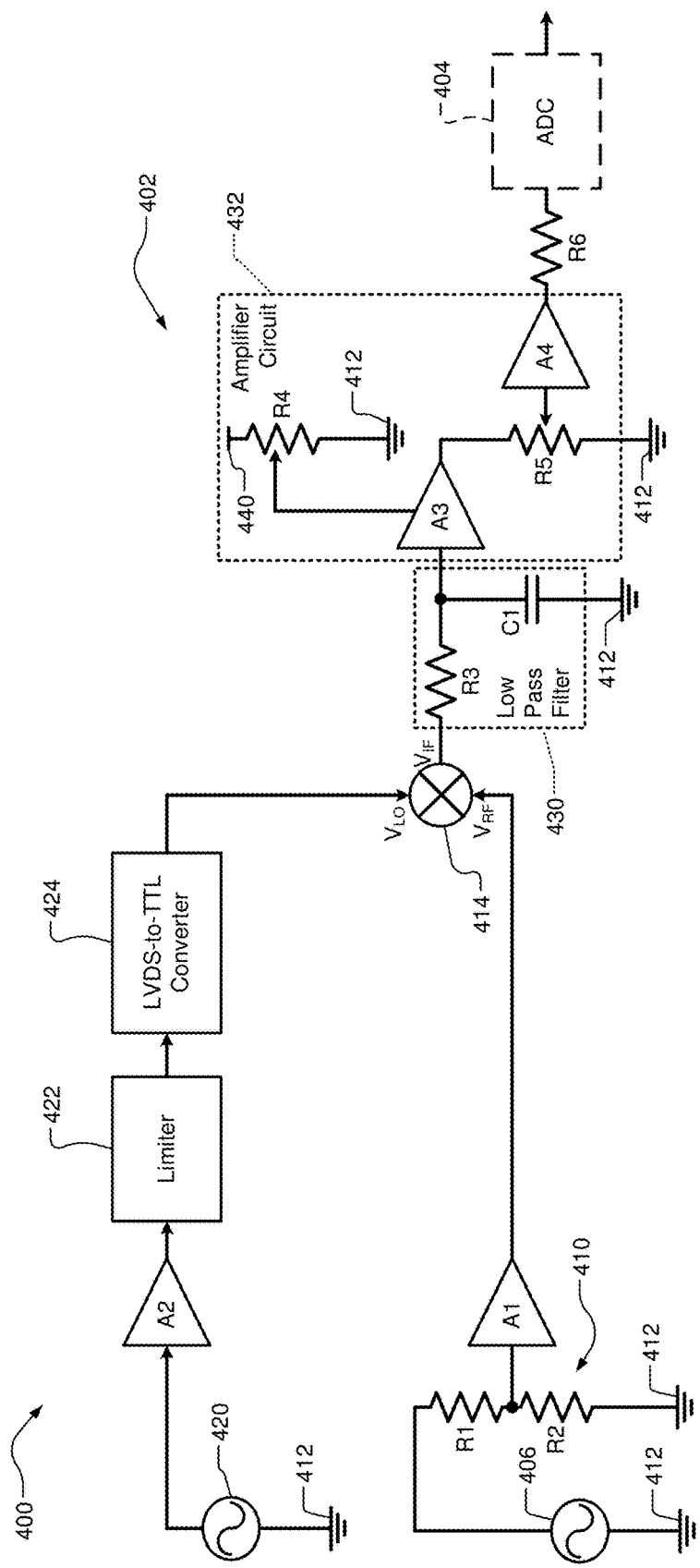
FIG. 4 is a functional block and schematic diagram of an example of a RF RMS detection circuit incorporating a non-self-locking lock-in amplifier including a reference local oscillator signal input in accordance with an embodiment of the present application.

FIG. 4 shows a RF RMS detection circuit 400 that includes a lock-in amplifier 402 and may include an ADC 404. RF RMS detection circuit 400 may replace one of the RF detectors 344 and 351 of FIG. 3. The lock-in amplifier 402 is a non-self-locking amplifier and may include a RF path that detects a RF signal from a RF source 406, such as via one of the signal lines/wires 348, 349 of FIG. 3. The RF path includes a voltage divider 410 and first buffer A1. The voltage divider 410 may be included as part of or separate from the lock-in amplifier 402. The voltage divider 410 includes resistors R1 and R2 and is connected between the RF source 406 and a ground reference terminal 412. Although the voltage divider 410 is shown as a resistor divider, the voltage divider 410 may be a broadband capacitor divider or a coupling coil. For example, a 1000:1 voltage divider may convert 1000 volts (V) to 1V. The voltage divider 410 sets scaling of signals being monitored. As another example, the voltage divider 410 may be used to convert a 1500:1 dynamic range RF sensor to a RF sensor that is capable of measuring 1-1500V, 2-3000V or 10-15000V. The voltage divider 410 reduces the voltage of the detected RF signal and provides the reduced voltage to the first buffer A1, which provides a RF voltage signal $V_{RF}$ to a DBM 414.

The lock-in amplifier 402 also includes a reference LO path, which includes a RF power source (or RF generator) 420 and a second buffer A2. The reference LO path may include a limiter 422 and/or a LVDS-to-TTL converter 424. The output of the reference LO path is a LO voltage signal $V_{LO}$. The mixer 414, as described above with respect to the mixers 108, 214 of FIGS. 1-2, generates an intermediate voltage signal $V_{IF}$ based on the RF voltage signal $V_{RF}$ and the reference LO signal $V_{LO}$. The intermediate voltage signal $V_{IF}$ is filtered by a low pass filter 430, amplified by an amplifier circuit 432 and provided to the ADC 404. The low pass filter 430 includes a resistor R3 and a capacitor C1. The amplifier circuit 432 includes a calibratable offset resistor R4, an amplifier A3, a calibratable gain resistor R5 and an amplifier A4. A filtered signal out of the low pass filter 430 is provided to the amplifier circuit 432. The resistor R4 is connected between a voltage supply terminal 440 and the ground reference terminal 412. The offset and the gain of the amplifier circuit 432 may be adjusted by adjusting resistances of R4 and R5. An output of the amplifier circuit 432 is provided to the ADC 404 via the resistor R6. In an embodiment, the lock-in amplifier 402 includes the voltage divider 410, the buffers A, A2, the limiter 422, the LVDS-to-TTL converter 424, the mixer 414, the low pass filter 430 and the amplifier circuit 432. The lock-in amplifier 402 may include the ADC 404.

Figure 5:
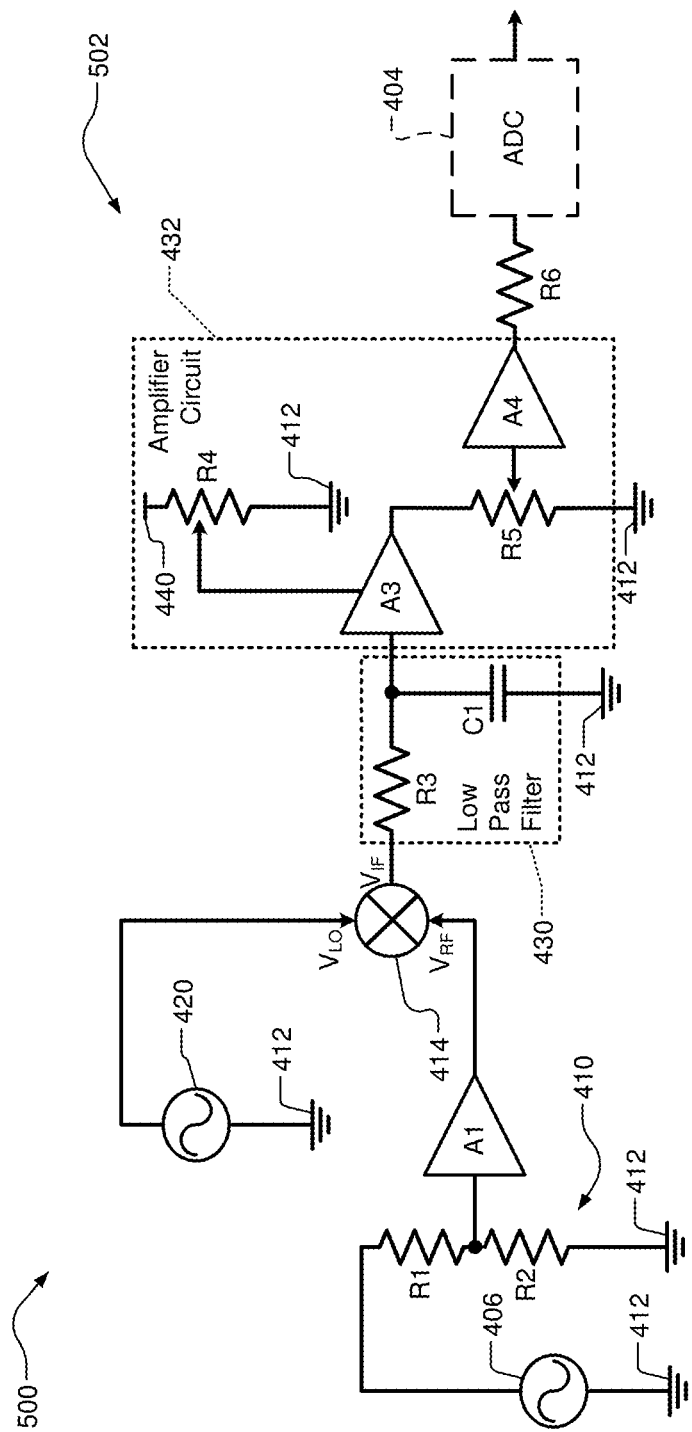
FIG. 5 is a functional block and schematic diagram of an example of a RF RMS detection circuit incorporating a lock-in amplifier without a limiter and a LVDS-to-TTL converter in accordance with an embodiment of the present application.

FIG. 5 shows a RF RMS detection circuit 500 incorporating a lock-in amplifier 502 without a limiter and/or a LVDS-to-TTL converter. The RF RMS detection circuit 500 may replace one of the RF detectors 344 and 351 of FIG. 3. The lock-in amplifier 502 may include a RF path that detects a RF signal from the RF source 406. The RF path includes the voltage divider 410 and first buffer A1. The voltage divider 410 may be included as part of or separate from the lock-in amplifier 502. The voltage divider 410 includes resistors R1 and R2 and is connected between the RF source 406 and a ground reference terminal 412. The voltage divider 410 provides the reduced voltage to the first buffer A1, which provides the RF voltage signal $V_{RF}$ to the DBM 414. The lock-in amplifier 502 also includes a reference LO path, which includes the RF power source (or RF generator) 420 and a second buffer A2. An output of the reference LO path is a LO voltage signal $V_{LO}$.

The mixer 414, as described above, generates an intermediate voltage signal $V_{IF}$ based on the RF voltage signal $V_{RF}$ and the reference LO signal $V_{LO}$. The intermediate voltage signal $V_{IF}$ is filtered by the low pass filter 430, amplified by the amplifier circuit 432 and provided to the ADC 404. The low pass filter 430 includes the resistor R3 and the capacitor C1. The amplifier circuit 432 includes the calibratable offset resistor R4, the amplifier A3, the calibratable gain resistor R5 and the amplifier A4. A filtered signal out of the low pass filter 430 is provided to the amplifier circuit 432. The resistor R4 is connected between the voltage supply terminal 440 and the ground reference terminal 412. The offset and the gain of the amplifier circuit 432 may be adjusted by adjusting resistances of R4 and R5. The output of the amplifier circuit 432 may be provided to the ADC 404 via the resistor R6.

As shown in FIGS. 4-5, the reference LO signal $V_{LO}$ may be fed either at the input and passed through a limiter to square up and remove any non-flat amplitude response, or alternatively may be fed directly into a mixer for mixing with a sine wave. Squaring up removes non-flat amplitude errors but introduces downconversion with a Sinc function (or sin x/x), which has multiple frequencies. If, however, a stable sine wave over the frequency dynamic range is generated and directly supplied to the mixer, then downconversion is accomplished for a single frequency.

Figure 6:
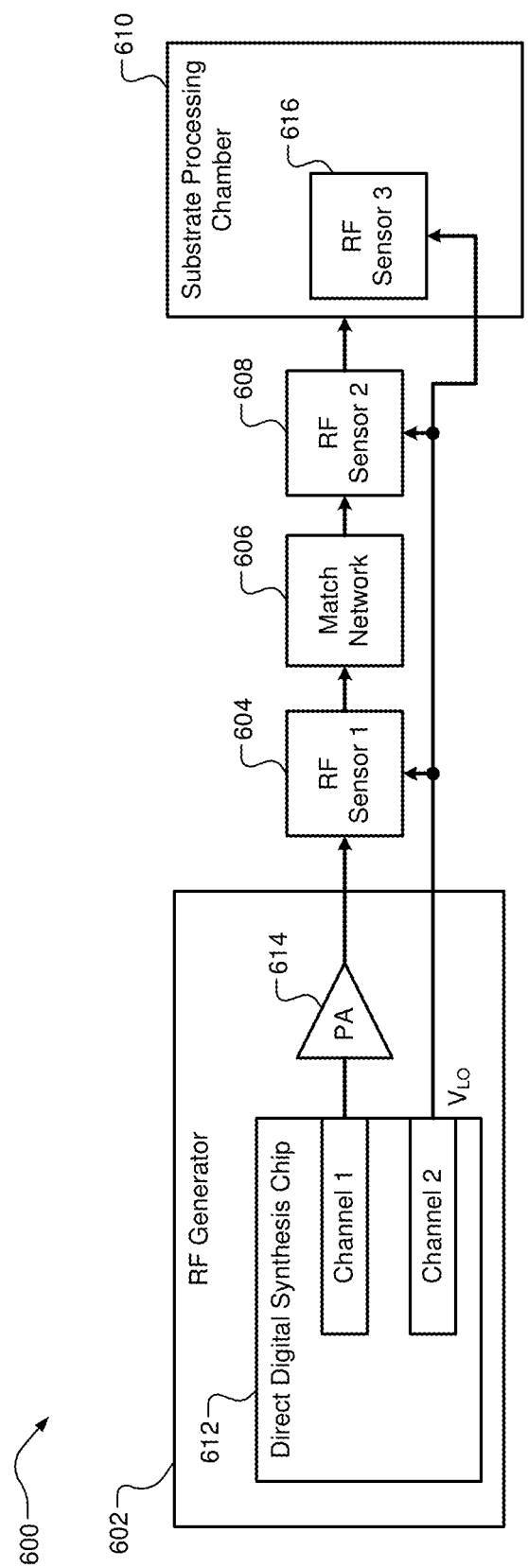
FIG. 6 is a functional block diagram an example of a RF RMS detection circuit illustrating locations of RF sensors in accordance with some embodiments of the present disclosure.

FIG. 6 shows a RF RMS detection circuit 600 that includes a RF generator 602, a first RF sensor 604, a match network 606, a second RF sensor 608 and a substrate processing chamber 610. The RF generator 602 may replace each of the RF power sources 316, 330 of FIG. 3 and includes a direct digital synthesis (DDS) chip 612 and a power amplifier 614. The DDS chip 612 generates RF signals that are output via one or more channels (e.g., Channels 1 and 2). In the example shown, Channel 1 provides a RF signal to the power amplifier 614, which amplifies the RF signal. The amplified RF signal is then provided to the match network 606 and then to the substrate processing chamber 610. The power amplifier 614 may be programmable. The substrate processing chamber 610 may include one or more RF sensors (e.g., RF sensor 616).

The RF sensors 604, 608, 616 may operate similarly as and/or replace the RF detectors 344, 351 of FIG. 3 and/or be configured similarly as the RF RMS detection circuit 400 of FIG. 4. The RF sensors 604, 608, 616 are shown to illustrate some example locations for RF sensors. The RF sensors 604, 608, 616 may be incorporated to detect RF signals out of the power amplifier 614, into the match network 606, out of the match network 606, into the substrate processing chamber 610 and/or in the substrate processing chamber 610. Channel 2 may be used to provide a reference LO signal to each of the RF sensors 604, 608, 616. The reference LO signal may be at a select reference frequency for the RF sensors 604, 608, 616 to lock on. The reference LO signal may be at a same or different frequency as the RF signal provided to the power amplifier 614. The frequency of the LO signal may be selected by the DDS chip and/or by a controller (e.g., the controller 346 of FIG. 3).

The DDS chip 612 and/or the power amplifier 614 may generate pulsed RF signals with programmable frequencies and phases. The DDS chip 612 and/or the power amplifier 614 may amplitude modulate the RF signal for different pulse widths and different frequencies. This may include 2 or more different pulse widths for different frequencies. The DDS chip 612 and/or the power amplifier 614 may determine a corresponding phase for each pulse width for each pulse sequence. The DDS chip 612 and/or the power amplifier 614 may perform frequency modulation per amplitude and/or pulse width per period of the generated RF signal. The DDS chip 612 and/or the power amplifier 614 may perform frequency modulation between pulse widths and/or adjust a frequency modulation rate of change of frequency between pulse widths.

Figure 7:
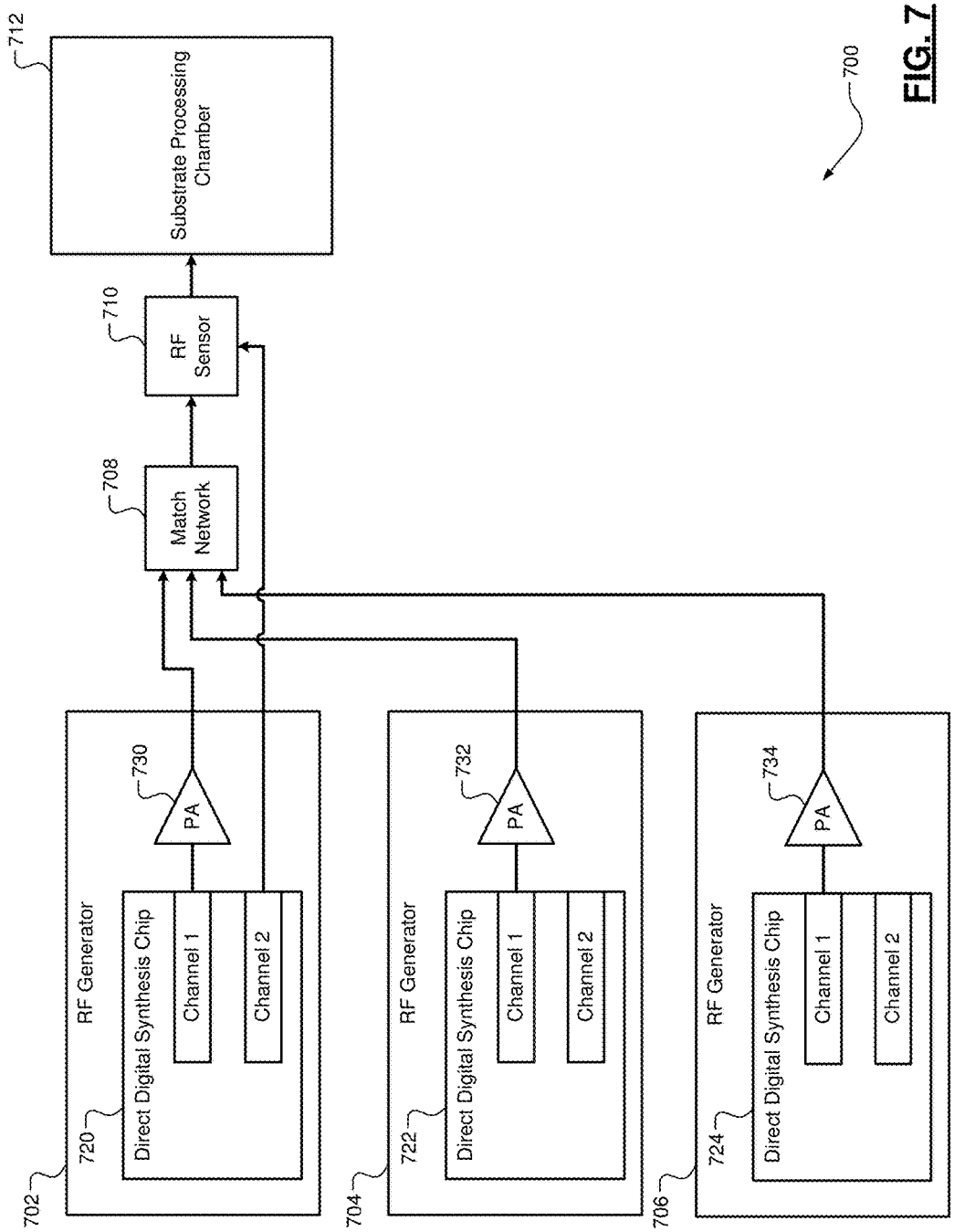
FIG. 7 is a functional block diagram of an example of a RF processing circuit incorporating multiple RF generators in accordance with an embodiment of the present disclosure.

FIG. 7 shows a RF processing circuit 700 incorporating multiple RF generators 702, 704, 706, a match network 708, a RF sensor 710 and a substrate processing chamber 712. The RF generators 702, 704, 706 may be configured and operate similarly as the RF generator 602 of FIG. 6. The RF generators 702, 704, 706 include respective DDS chips 720, 722, 724, channels, and power amplifiers 730, 732, 734.

Outputs of the power amplifiers 730, 732, 734 are provided to the match network 708, which may combine the received outputs of the power amplifiers 730, 732, 734 and supply a resultant RF signal to the substrate processing chamber 712. Each of the RF signals provided by the power amplifiers 730, 732, 734 may be generated based on respective reference clock signals supplied to and/or generated internal to the DDS chips 720, 722, 724. As a result, if the RF generators 702, 704, 706 are supplying RF signals based on a same set frequency to the match network 708, differences in componentry and/or operations of the DDS chips 720, 722, 724 (e.g., manufacturing differences between the DDS chips 720, 722, 724) can result in the RF signals having slightly different frequencies. This is a possible source of error.

In this example, an output of channel 2 of the RF generator 702 is provided as a reference LO signal $V_{LO}$ to the RF sensor 710. The RF sensor 710 may be configured and/or operate similarly as other RF sensors disclosed in FIGS. 3-6.

Figure 8:
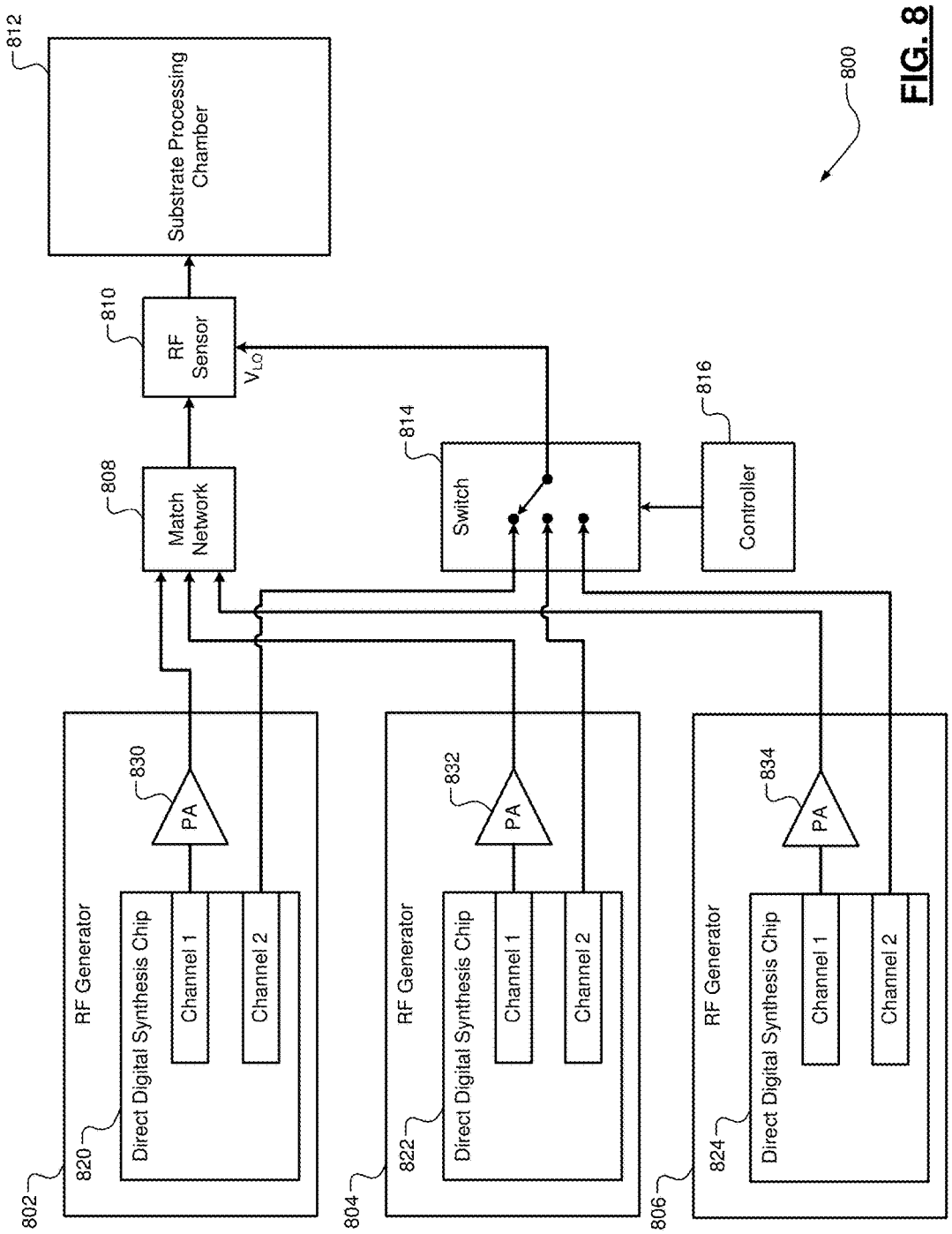
FIG. 8 is a functional block diagram of an example of a RF processing circuit incorporating a switch to select outputs of RF generators in accordance with an embodiment of the present disclosure.

FIG. 8 shows a RF processing circuit 800 incorporating multiple RF generators 802, 804, 806, a match network 808, a RF sensor 810, a substrate processing chamber 812, a switch (or multiplexer) 814 and a controller 816. The RF generators 802, 804, 806 may be configured and operate similarly as the RF generator 602 of FIG. 6. The RF generators 802, 804, 806 include respective DDS chips 820, 822, 824, channels, and power amplifiers 830, 832, 834.

Outputs of the power amplifiers 830, 832, 834 are provided to the match network 808, which may combine the received outputs of the power amplifiers 830, 832, 834 and supply a resultant RF signal to the substrate processing chamber 812. Each of the RF signals provided by the power amplifiers 830, 832, 834 may be generated based on respective reference clock signals supplied to and/or generated internal to the DDS chips 820, 822, 824. As a result, if the RF generators are supplying RF signals based on a same set frequency to the match network 808, differences in componentry and/or operations of the DDS chips (e.g., manufacturing differences between the DDS chips 820, 822, 824) can result in the RF signals having slightly different frequencies. This is a possible source of error.

In this example, an output of each Channel 2 of the RF generators 802, 804, 806 is provided as a reference LO signal to the switch 814. The controller 816 controls operation of the switch 814 to select a reference LO signal from one of the Channel 2 outputs of the RF generators 802, 804, 806. An output of the switch 814 is provided as a reference LO signal $V_{LO}$ to the RF sensor 810. The RF sensor 810 may be configured and/or operate similarly as other RF sensors disclosed in FIGS. 3-6.

The configuration of FIG. 8 allows a fundamental frequency and harmonics of the RF signals out of the power amplifiers 830, 832, 834 to be precisely measured. This configuration may however be a source of error for measuring intermodulation frequencies (e.g., $\omega_1 \pm \omega_2$, where $\omega$ is frequency and each of $\omega_1$ and $\omega_2$ is a frequency of one of the generated RF signals out of the power amplifiers 830, 832, 834 or a harmonic thereof).

Figure 9:
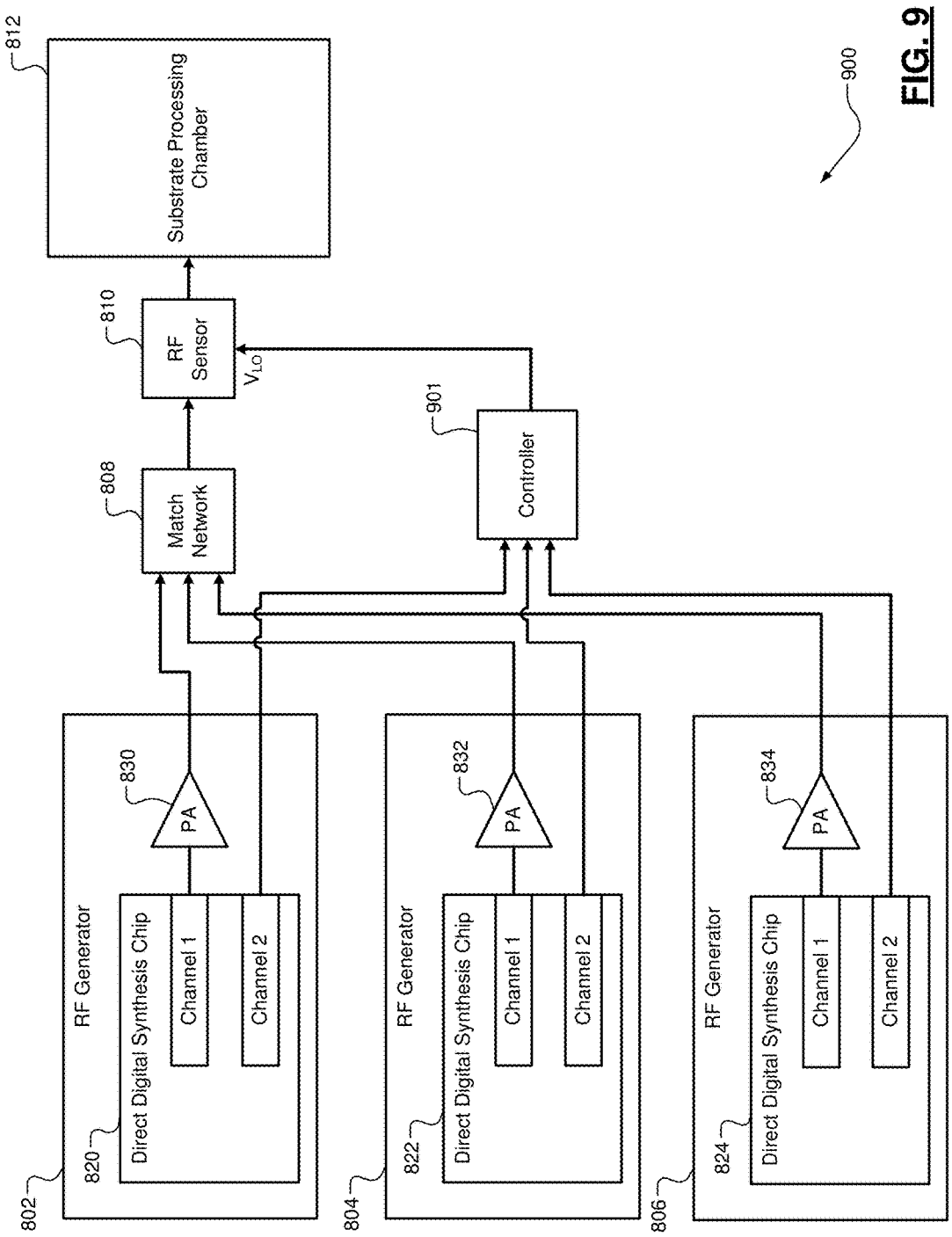
FIG. 9 is a functional block diagram of an example of a RF processing circuit incorporating a controller to select outputs of RF generators in accordance with an embodiment of the present disclosure.

FIG. 9 shows a RF processing circuit 900 that is similar to the RF processing circuit 800 of FIG. 8, except a controller 901 replaces the switch 814 and the controller 816 of FIG. 8. The RF processing circuit 900 includes the RF generators 802, 804, 806, the match network 808, the RF sensor 810, the substrate processing chamber 812, and the controller 901. The RF generators 802, 804, 806 include the DDS chips 820, 822, 824, channels, and power amplifiers 830, 832, 834.

In this example, an output of each channel 2 of the RF generators 802, 804, 806 is provided as a reference LO signal $V_{LO}$ to the controller 901. The controller 901 selects an output of the RF generators 802, 804, 806 to forward to the RF sensor 810.

Figure 10:
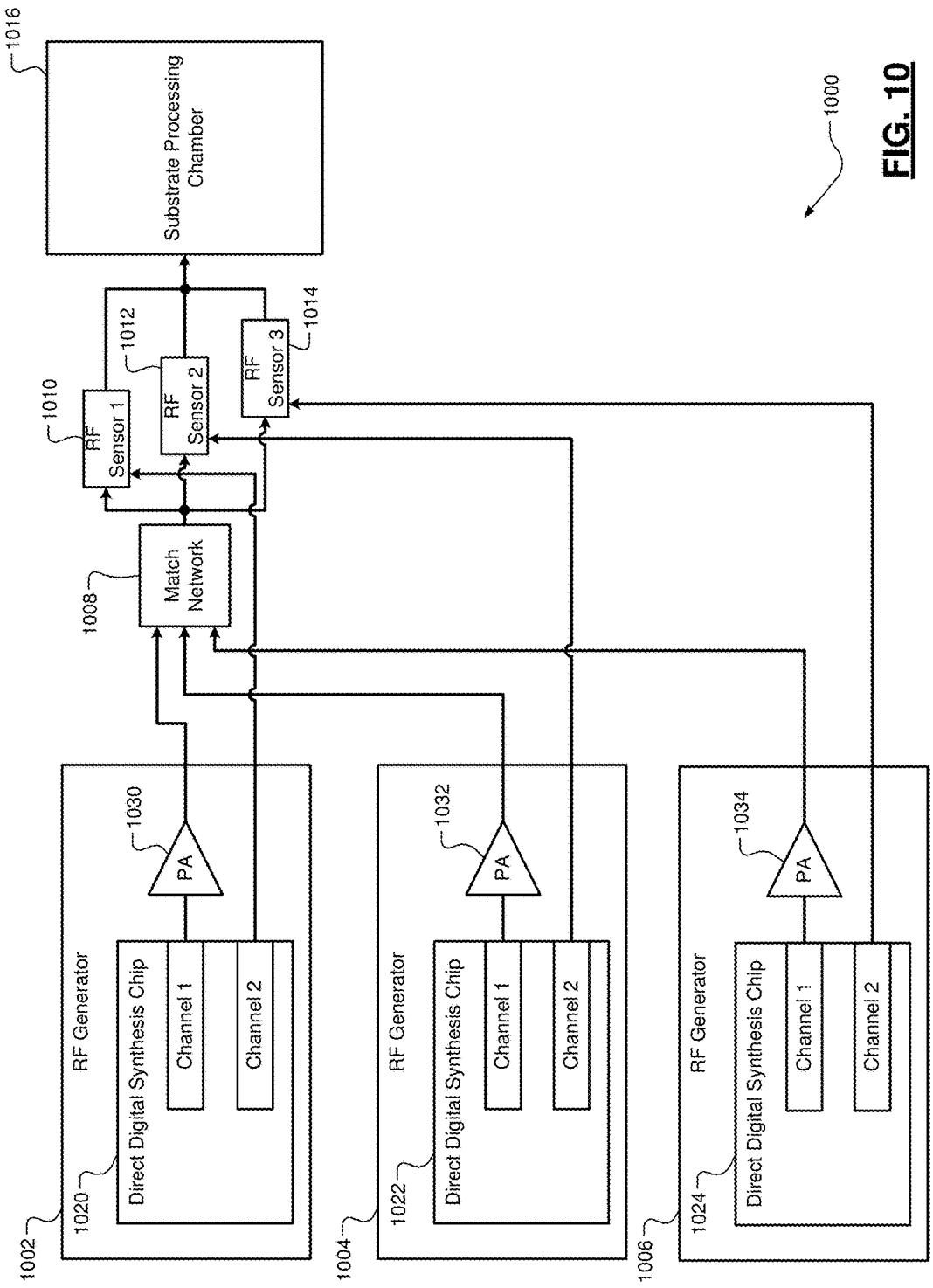
FIG. 10 is a functional block diagram of an example of a RF processing circuit incorporating a RF sensor for each of multiple RF generators in accordance with an embodiment of the present disclosure.

FIG. 10 shows a RF processing circuit 1000 incorporating RF generators 1002, 1004, 1006, a match network 1008, RF sensors 1010, 1012, 1014 and a substrate processing chamber 1016. The RF generators 1002, 1004, 1006 may be configured and operate similarly as the RF generator 602 of FIG. 6. The RF generators 1002, 1004, 1006 include respective DDS chips 1020, 1022, 1024, channels, and power amplifiers 1030, 1032, 1034.

Outputs of the power amplifiers 1030, 1032, 1034 are provided to the match network 1008, which may combine the received outputs of the power amplifiers 1030, 1032, 1034 and supply a resultant RF signal to the substrate processing chamber 1016. Each of the RF signals provided by the power amplifiers 1030, 1032, 1034 may be generated based on respective reference clock signals supplied to and/or generated internal to the DDS chips 1020, 1022, 1024.

In this example, an output of the match network 1008 is provided to each of the RF sensors 1010, 1012, 1014. The outputs of the RF sensors 1010, 1012, 1014 may be provided to a same electrode or different electrodes in the substrate processing chambers 1016. An output of Channel 2 of each of the RF generators 1002, 1004, 1006 is provided as a reference LO signal $V_{LO}$ to a respective one of the RF sensors 1010, 1012, 1014. The RF sensors 1010, 1012, 1014 may be configured and/or operate similarly as other RF sensors disclosed in FIGS. 3-6.

In the configuration of FIG. 10, a fundamental frequency and harmonics can be precisely measured by the RF sensors 1010, 1012, 1014. Intermodulation frequencies (e.g., $\omega_1 \pm \omega_2$, where $\omega$ is frequency and each of $\omega_1$ and $\omega_2$ is a frequency of one of the generated RF signals out of the power amplifiers 1030, 1032, 1034 or a harmonic thereof), from different time bases may be a source of error.

Figure 11:
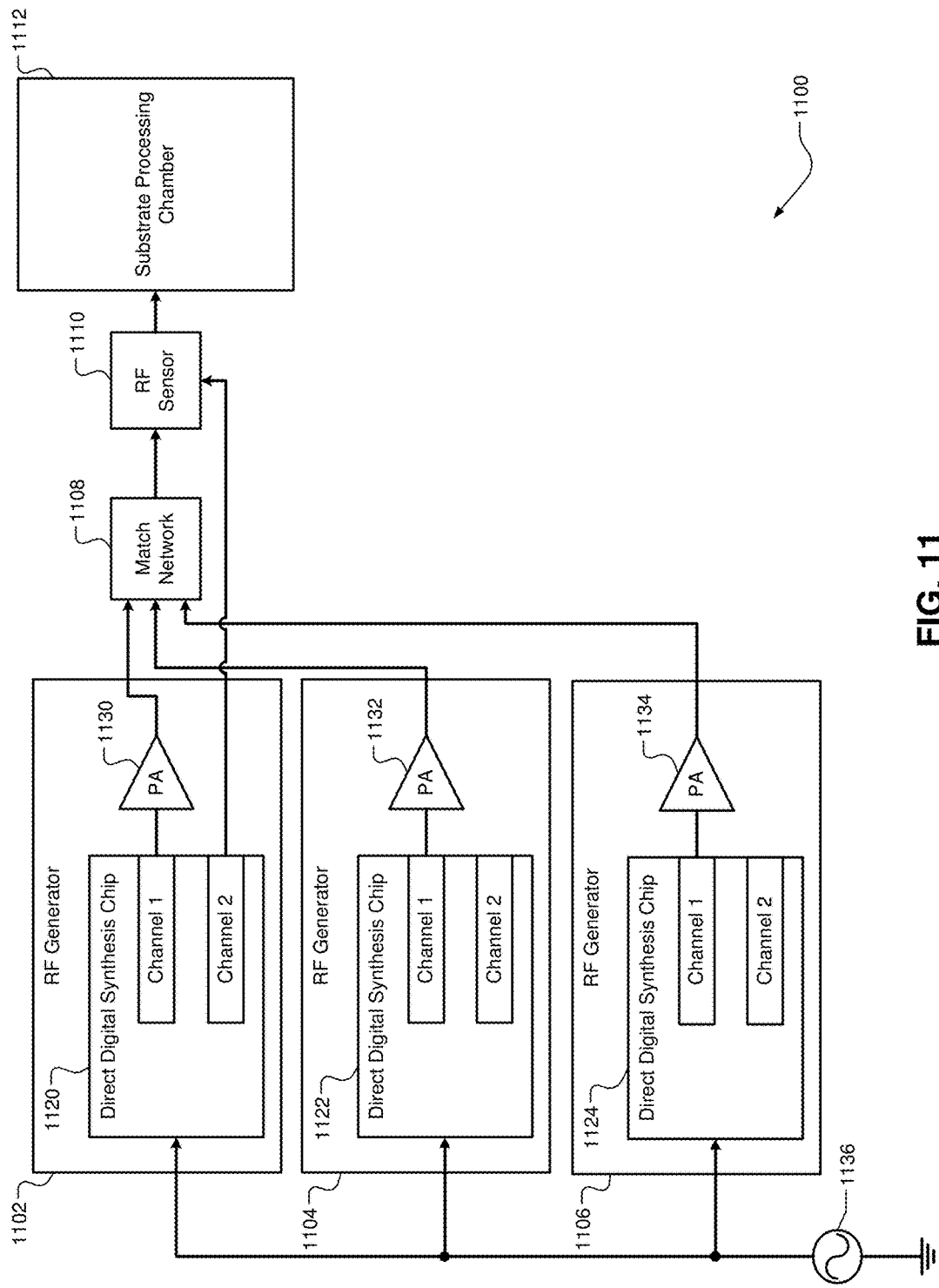
FIG. 11 is a functional block diagram of an example of a RF processing circuit with RF generators synchronized to a same RF input clock signal in accordance with an embodiment of the present disclosure.

FIG. 11 shows a RF processing circuit 1100 with generators synchronized to a same RF input clock signal. The RF processing circuit 1100 is configured similarly as the RF processing circuit 700 of FIG. 7, except each DDS chip receives and operates based on a same RF input clock signal. The RF processing circuit 1100 includes multiple RF generators 1102, 1104, 1106, a match network 1108, a RF sensor 1110 and a substrate processing chamber 1112. The RF generators 1102, 1104, 1106 include respective DDS chips 1120, 1122, 1124, channels, and power amplifiers 1130, 1132, 1134.

Outputs of the power amplifiers 1130, 1132, 1134 are provided to the match network 1108, which may combine the received outputs of the power amplifiers 1130, 1132, 1134 and supply a resultant RF signal to the substrate processing chamber 1112. Each of the RF signals provided by the power amplifiers 1130, 1132, 1134 is generated based on the RF input clock signal from a RF reference clock source 1136. The RF reference clock source 1136 may be referred to as a master RF clock. Since all of the DDS chips 1120, 1122, 1124 are clocked based on the same master RF clock, there is not a source of error with regards to harmonics and intermodulation frequencies.

In this example, an output of Channel 2 of the first RF generator 1102 is provided as a reference LO signal $V_{LO}$ to the RF sensor 1110. The RF sensor 1110 may be configured and/or operate similarly as other RF sensors disclosed in FIGS. 3-6. The configuration of FIG. 11 may be used for measuring a fundamental frequency, harmonic frequencies and intermodulation frequencies.

Figure 12:
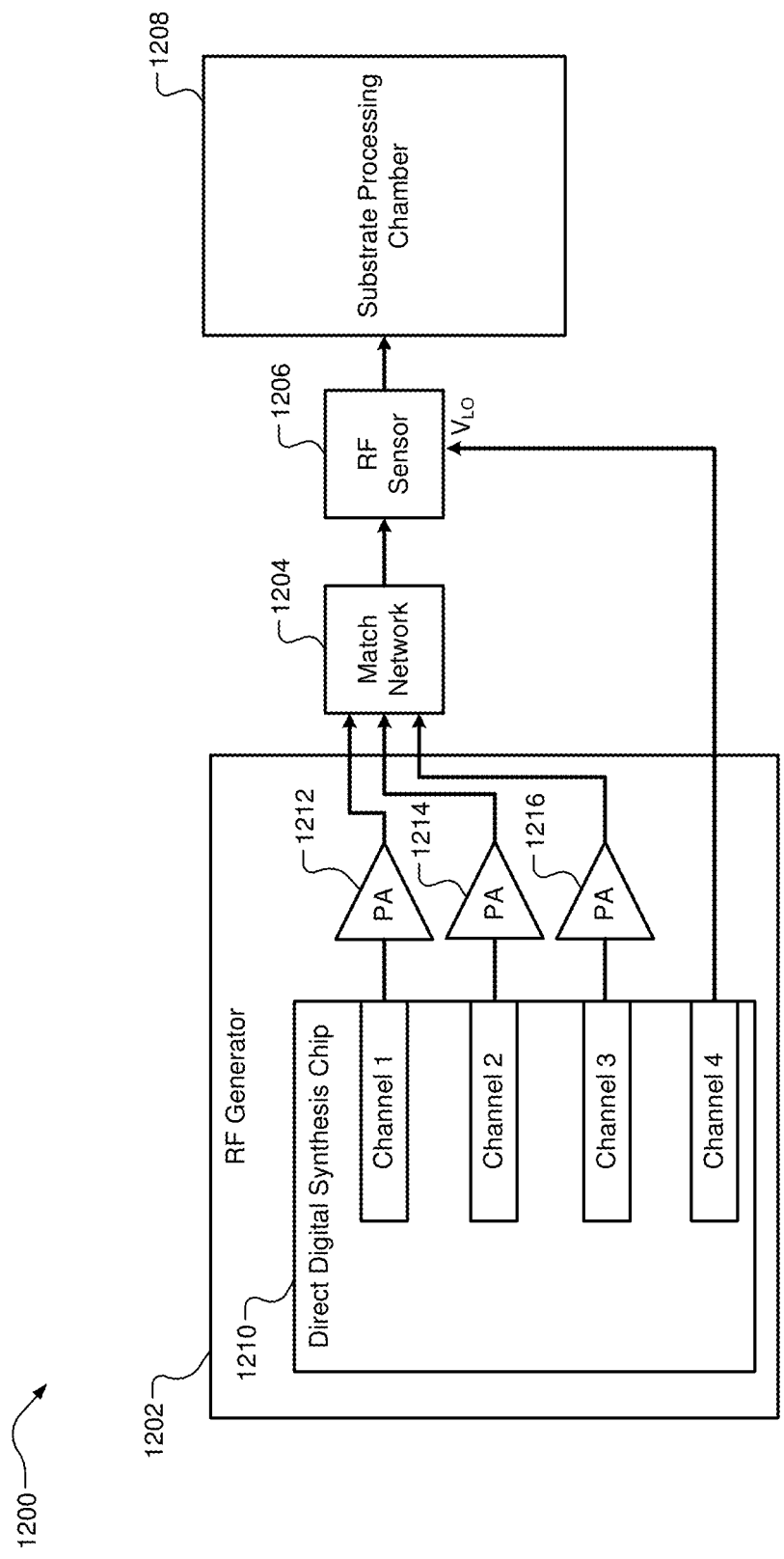
FIG. 12 is a functional block diagram of an example of a RF processing circuit illustrating a direct digital synthesizer (DDS) chip having multiple channels supplying RF signals to a matching network and another channel providing a reference local oscillator signal to a RF sensor in accordance with an embodiment of the present disclosure.

FIG. 12 shows a RF processing circuit 1200 that includes a RF generator 1202, a match network 1204, a RF sensor 1206 and a substrate processing chamber 1208. The RF generator 1202 includes a DDS chip 1210 having multiple channels (e.g., Channels 1-3) supplying RF signals to the match network 1204 via power amplifiers 1212, 1214, 1216. One of the channels (e.g., Channel 4) provides as a reference LO signal $V_{LO}$ to the RF sensor 1206.

In the example of FIG. 12, each of the power amplifiers 1212, 1214, 1216 may output different RF frequencies to the match network 1204. The RF signals may be based on a same time base and/or RF reference clock source, since the RF signals are generated by the same DDS chip 1210. The DDS chip 1210 may provide a reference LO signal $V_{LO}$ to the RF sensor 1206, which may be selected by the DDS chip 1210 or a controller (e.g., any one of the controllers disclosed herein). The reference LO signal $V_{LO}$ may be at a same frequency as one of the RF signals, a harmonic thereof and/or an intermodulation frequency.

The RF voltage signal $V_{RF}$ provided by each of the channels to the match network 1204 has complicated non-linear composition made up of fundamental frequencies, harmonic frequencies, and intermodulation frequencies and corresponding phase shifts. An output of the match network 1204 may be represented by equation 4.

$$V_{RF} = \sum_{\infty} A_i \cos(f_i t + \phi_i) \quad (4)$$

Each of the signals output from the Channels 1-4 have respective frequencies $f_1$, $f_2$, $f_3$, $f_4$, phases $\phi_1$, $\phi_2$, $\phi_3$, $\phi_4$ and amplitudes $A_1$, $A_2$, $A_3$, $A_4$. The frequency $f_4$ may be set to any selected frequency including $f_1$, $f_2$, $f_3$, harmonics (e.g., multiples of $f_1$, $f_2$, $f_3$), intermodulation frequencies (e.g., $f_1 \pm f_2$, $f_1 \pm 2f_2$, $f_1 \pm 3f_2$, $f_2 \pm f_3$, $f_1 \pm f_3$, etc.). During operation, the phase of the signal out of Channel 4 may be swept to find a sensor output maximum MAX or minimum MIN, as further described below. This may begin using preset or predetermined learned values. The values of frequencies $f_1$, $f_2$, $f_3$, $f_4$, the phases $\phi_1$, $\phi_2$, $\phi_3$, $\phi_4$ and the amplitudes $A_1$, $A_2$, $A_3$, $A_4$ may be continuously changing during operation of the corresponding plasma processing system. A closed loop control algorithm may be used to control $f_4$, $\phi_4$, and $A_4$.

Figure 13:
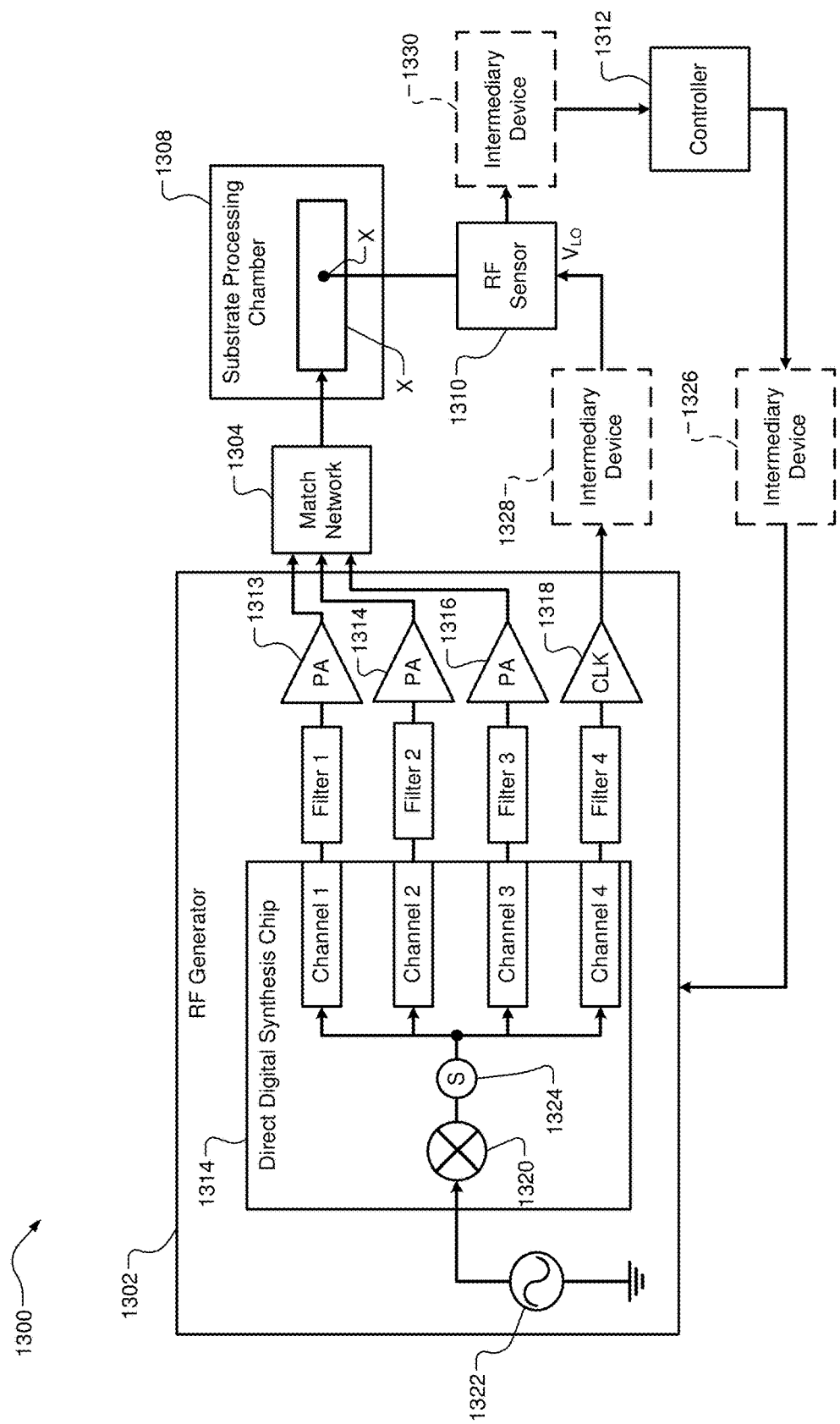
FIG. 13 is a functional block diagram of an example of a RF processing circuit illustrating a RF generator having a DDS chip with multiple channels operating based on a same RF reference clock and corresponding RF generator control in accordance with an embodiment of the present disclosure.

FIG. 13 shows a RF processing circuit 1300 that includes a RF generator 1302, a match network 1304, a substrate processing chamber 1308, a RF sensor 1310 and a controller 1312. The RF generator 1302 includes a DDS chip 1314 having multiple channels (e.g., Channels 1-3) supplying RF signals to the match network 1304 via filters (e.g., Filters 1-3) and power amplifiers 1313, 1314, 1316. One of the channels (e.g., Channel 4) provides a reference LO signal $V_{LO}$ to the RF sensor 1310 via a filter (e.g., Filter 4) and a clock amplifier 1318. Although the filters and a clock amplifier are not shown as being incorporated in some embodiments (e.g., the embodiments of FIGS. 6-12), similar filters and/or similar clock amplifiers may be incorporated in the embodiments.

The DDS chip 1314 further includes a phase lock loop (PLL) 1320 that receives a RF reference clock signal from a reference clock source 1322. The PLL 1320 may operate as a frequency upconverter (or frequency multiplier), such that an output of the PLL has a frequency that is a multiple of a frequency of the RF reference clock signal. An output of the PLL 1320 is provided to a splitter 1324, which provides the output of the PLL 1320 to each of the channels.

The controller 1312 may control operation of the RF generator 1302, the DDS chip 1314, the RF reference clock source 1322, the PLL 1320, the PAs 1313, 1314, 1316, and the clock amplifier 1318. This may include: selection of the frequency of the RF reference clock signal; the amount of frequency upconversion performed by the PLL 1320; amplitude and/or frequency modulation parameters associated with the power amplifiers 1313, 1314, 1316; amplification of the clock amplifier 1318; etc. These items may be provided to the RF generator 1302 via one or more intermediary devices (e.g., intermediary device 1326). The intermediary devices may be network devices connected between the controller 1312 and the RF generator 1302. One or more intermediary devices may also be connected between the RF generator 1302 and the RF sensor 1310 and/or between the RF sensor 1310 and the controller 1312 (e.g., intermediary devices 1328, 1330). The intermediary devices may be Ethernet devices operating according to Ethernet protocols and/or other network devices operating according to other communication protocols. The intermediary devices may be remotely located away from the RF generator 1302, the RF sensor 1310, and/or the controller 1312. Although the intermediary devices are not shown in other figures, the intermediary devices may be disposed between other RF generators, RF sensors, controllers and/or other circuit elements, such as switches, multiplexers, etc. disclosed herein.

The DDS chip 1314 may have registers dedicated for each of the channels. The registers of each of the channels may store frequency, phase and/or amplitude values. Output filters of the DDS chip 1314 and/or Filters 1-4 may be used to maintain amplitude flat output signals, where the signals out of the channels and/or filters do not change in amplitude when frequencies of the signals change. The amplitudes of the signals are independent of the frequency of the signals. This may at least hold true for a bandwidth of frequencies being generated and/or monitored.

Figure 14:
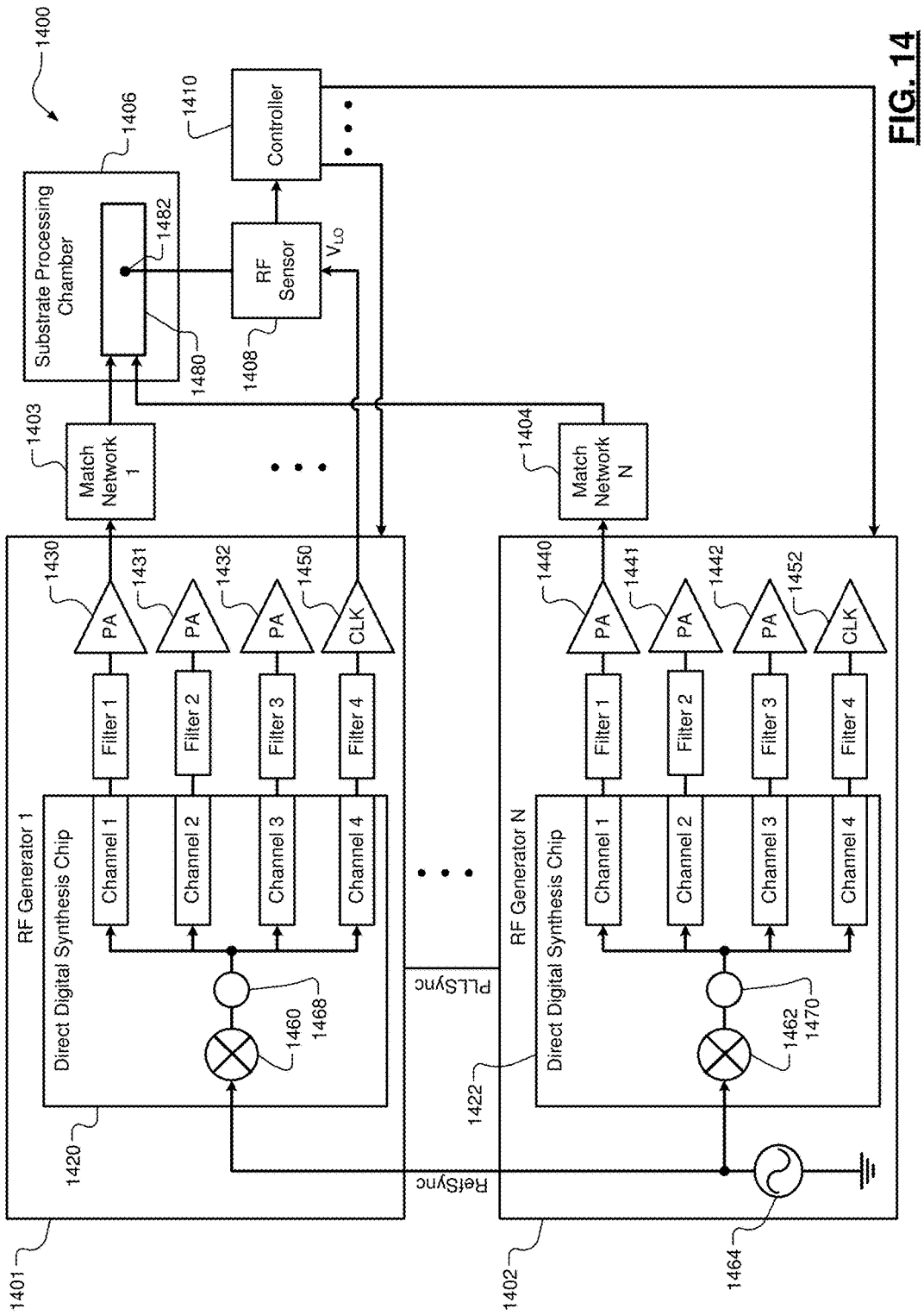
FIG. 14 is a functional block diagram of an example of a RF processing circuit illustrating RF detection of RF signals from multiple RF generators in accordance with an embodiment of the present disclosure.

FIG. 14 shows a RF processing circuit 1400 that includes two or more RF generators (e.g., RF generators 1401, 1402), respective match networks (e.g., match networks 1403, 1404), a substrate processing chamber 1406, a RF sensor 1408 and a controller 1410. Each of the RF generators may be configured similarly as the RF generator 1302 of FIG. 13. Each of the RF generators includes a DDS chip (e.g., DDS chips 1420, 1422) having multiple channels (e.g., Channels 1-3) supplying RF signals to the match networks via filters (e.g., Filters 1-3) and power amplifiers (e.g., the power amplifiers 1430, 1431, 1432, 1440, 1441, 1442). One of the channels (e.g., Channel 4) of one of the DDS chips may provide a reference LO signal $V_{LO}$ to the RF sensor 1408 via a filter (e.g., Filter 4 of the first RF generator 1401) and a clock amplifier 1450.

The DDS chips 1421, 1422 may each further include a PLL (e.g., PLLs 1460, 1462) that receives a RF reference clock signal RefSync from a reference clock source (e.g., reference clock source 1464). The reference clock source may be programmed and/or the frequency and/or duty cycle of the RF reference clock signal RefSync may be set via the controller 1410. The RF reference clock signal RefSync synchronizes the RF generators, such that each of the RF generators is operating based on a same reference clock frequency. The PLLs may each operate as a frequency upconverter (or frequency multiplier), such that an output of the PLL has a frequency that is a multiple of a frequency of the corresponding RF reference clock signal. The phases of the PLLs may be synchronized via a phase synchronization signal PLLSync. One of the DDS chips may operate as a master and the other DDS chips may operate as slaves and adjust corresponding phases to match the phase of the master DDS chip. The outputs of the PLLs are provided to splitters (e.g., splitters 1468, 1470), which provides the outputs of the PLLs to the channels of the DDS chips.

The controller 1410 may control operation of the RF generators 1401, 1402, the DDS chips 1420, 1422, the RF reference clock source 1464, the PLLs 1460, 1462, the PAs 1430, 1431, 1432, 1440, 1441, 1442, and the clock amplifiers 1450, 1452. This may include: selection of the frequency of the RF reference clock signal; the amount of frequency upconversion performed by the PLLs 1460, 1462; amplitude and/or frequency modulation parameters associated with the power amplifiers 1430, 1431, 1432, 1440, 1441, 1442; amplification of the clock amplifiers 1450, 1452; etc.

Outputs of the match networks may be provided to, for example, components within the substrate processing chamber 1406. As an example, the outputs may be provided to substrate support 1480. The RF sensor 1408 may detect via an electrode 1482 RF signals in the substrate support 1480. Although a single RF sensor 1408 is shown, any number of RF sensors may be included. The controller 1410 may receive the output of the RF sensor 1408 and control operations of the RF generators based on the received output, for example, as described above with respect to FIG. 13.

FIG. 15 shows a RF processing circuit 1500 that includes a RF generator 1502, a match network 1504, a RF sensor 1506, a substrate processing chamber 1508 and a controller 1510. The RF generator 1502 includes power amplifiers 1512, 1514, 1516. The controller 1510 includes a DDS chip 1520 with channels (e.g., Channels 1-4). The controller 1510 may control operation of the DDS chip 1520. The DDS chip 1520 may generate RF signals to be amplified by the power amplifiers 1512, 1514, 1516 and then provided to the match network 1504. One of the channels (e.g., Channel 4) of the DDS chip 1520 may provide a reference LO signal $V_{LO}$ to the RF sensor 1506. The controller 1510 may control selection of a frequency of the reference LO signal $V_{LO}$. Although a single RF generator is shown, any number of RF generators may be included and controlled by the controller 1510. The controller 1510 may include a DDS chip designated for each RF generator or may include a DDS chip for each set of one or more RF generators.

For the configuration of FIG. 15, the controller 1510 controls the RF frequency, phase and amplitude of the RF generators and corresponding channels. The controller 1510 also controls the selected frequency, phase and/or amplitude of the reference LO signal $V_{LO}$ provided to the RF sensor 1506.

A DDS (or alternative low-voltage waveform generator) may be used to control the reference LO signal $V_{LO}$ to provide feedforward prediction of an initial target between $\phi_{RF}$ and $\phi_{LO}$. This may remove a need to tune a phase of the reference LO signal $V_{LO}$.

Figure 16:
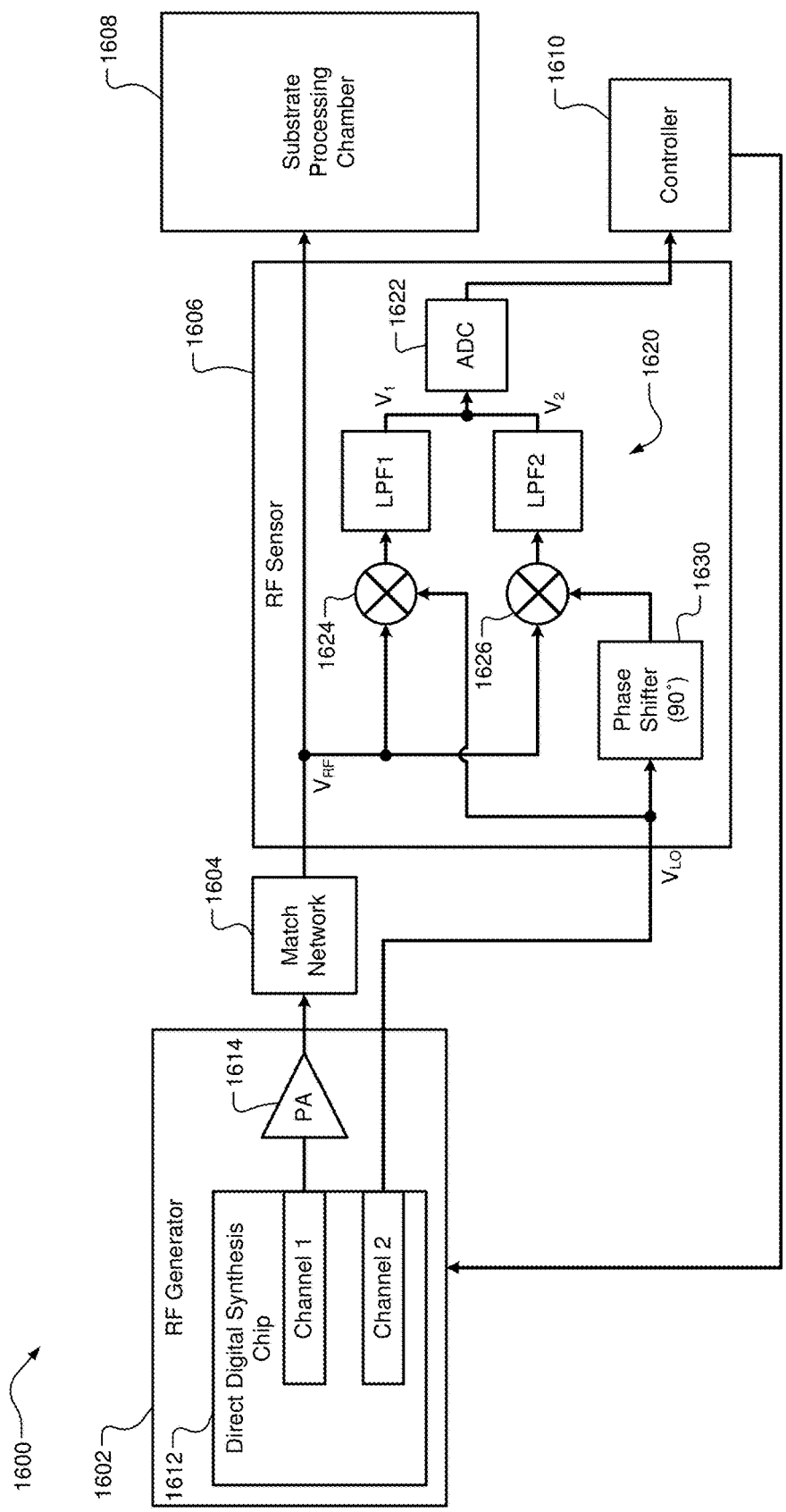
FIG. 16 is a functional block diagram of an example of a RF processing circuit incorporating a RF sensor with a phase-independent lock-in amplifier in accordance with an embodiment of the present disclosure.

FIG. 16 shows a RF processing circuit 1600 that includes a RF generator 1602, a match network 1604, a RF sensor 1606, a substrate processing chamber 1608 and a controller 1610. The RF generator 1602 includes a DDS chip 1612 and a power amplifier 1614. The RF sensor 1606 includes a phase-independent lock-in amplifier 1620 and an ADC 1622. The phase-independent lock-in amplifier 1620 includes a first mixer (or multiplier) 1624, a second mixer (or multiplier) 1626, a first low pass filter LPF1, a second low pass filter LPF2, and a phase shifter 1630.

The DDS chip 1612 includes channels (e.g., Channels 1-2). As an example, an output of Channel 1 is provided to the power amplifier 1614. An output of the Power amplifier 1614 is provided to the match network 1604. The output of the match network 1604 is provided to each of the mixers 1624, 1626. Channel 2 may output a reference LO signal $V_{LO}$, which is provided to the first mixer 1624 and to the phase shifter 1630. The phase shifter 1630 phase shifts the reference LO signal $V_{LO}$ 90°. An output of the phase shifter 1630 is provided to the second multiplier 1626. The outputs of the mixers 1624, 1626 are provided respectively to the low pass filters LPF1, LPF2. Outputs of the low pass filters LPF1, LPF2 are provided to the ADC 1622. The controller 1610 receives a digital output signal from the ADC 1622 and may control operation of the RF generator 1602 based on the digital output signal.

The configuration of FIG. 16 includes a dual channel sensor that receives the reference LO signal $V_{LO}$ and (i) multiplies the reference LO signal $V_{LO}$ by the detected RF signal $V_{RF}$, and (ii) multiplies a 90° phase-shifted version of the reference LO signal $V_{LO}$ by the detected RF signal $V_{RF}$. The output of the match network 1604 may be represented as $V_{RF} \cos(f_{RF}t+\phi_{RF})$. The output of Channel 2 may be represented as $V_{LO} \cos(f_{LO}t+\phi_{LO})$. Output voltage $V_1$ of LPF1 may be represented by equation 5. Output voltage $V_2$ of LPF2 may be represented by equation 6. A combination of $V_1$ and $V_2$ as provided to the ADC 1622 may be represented by equation 7.

$$V_1 = \frac{1}{2} V_{RF} V_{LO} \sin(\phi_{RF} - \phi_{LO}) \tag{5}$$

-continued $$V_2 = \frac{1}{2} V_{RF} V_{LO} \sin(\phi_{RF} - \phi_{LO} + 90) = \frac{1}{2} V_{RF} V_{LO} \cos(\phi_{RF} - \phi_{LO}) \quad (6)$$

$$V_{Tot} = \sqrt{V_1^2 + V_2^2} = \sqrt{\frac{1}{4} V_{RF}^2 V_{LO}^2 (\sin^2 \Delta\phi + \cos\Delta\phi)} = \frac{1}{2} V_{RF} V_{LO} \quad (7)$$

Measuring with two quadrature LOs, one 90° out-of-phase from the other, eliminates the phase error or $\Delta\phi = \sigma_{RF} - \phi_{LO} \neq 0$ error.

With dual channel RF sensors measuring a same input and by phase-shifting the $2^{nd}$ channel (or LO channel) phase $\phi_{LO}$ by 90-degrees, creates both a sine and cosine relationship. By taking a magnitude of both channels, a phase-independent lock-in amplifier is provided removing the cos $\Delta\phi$ term.

As another example, the output of Channel 2 of FIG. 16 (i.e. the reference LO signal $V_{LO}$) may be provided to the input of the first mixer 1624 and not to the input of the second mixer 1626. For this example, the DDS chip 1612 may include a third channel (Channel 3) that connects to the input of the second mixer 1626 instead of the output of Channel 2. Channel 3 may phase shift the reference LO signal $V_{LO}$ by 90° and provide the phase shifted reference LO signal $V_{LO}$ signal to the second mixer 1626.

Although not shown in FIG. 16, a voltage divider (e.g., the voltage divider 410 of FIG. 4) and a buffer (e.g., the buffer A1 of FIG. 4) may be connected between the match network 1604 and the mixers 1624, 1626. Also, although not shown in FIG. 16, a buffer (e.g., the buffer A2 of FIG. 4) may be connected between (i) Channel 2, and (ii) the mixer 1624 and the phase shifter 1630.

Figure 17A:
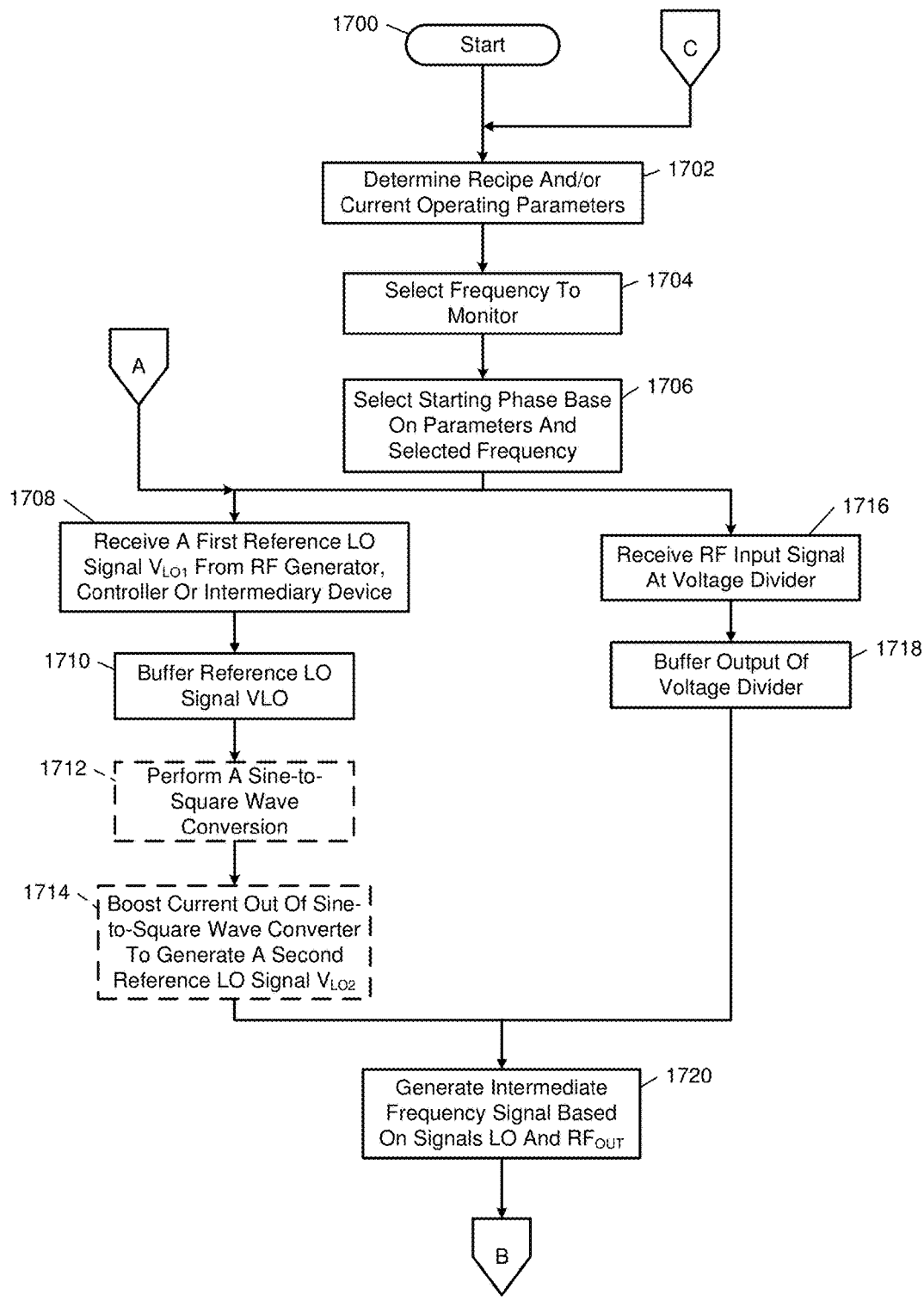
FIGS. 17A and 17B (collectively referred to as FIG. 17) illustrate an example method of operating an RF control circuit in accordance with an embodiment of the present disclosure.
Figure 17B:
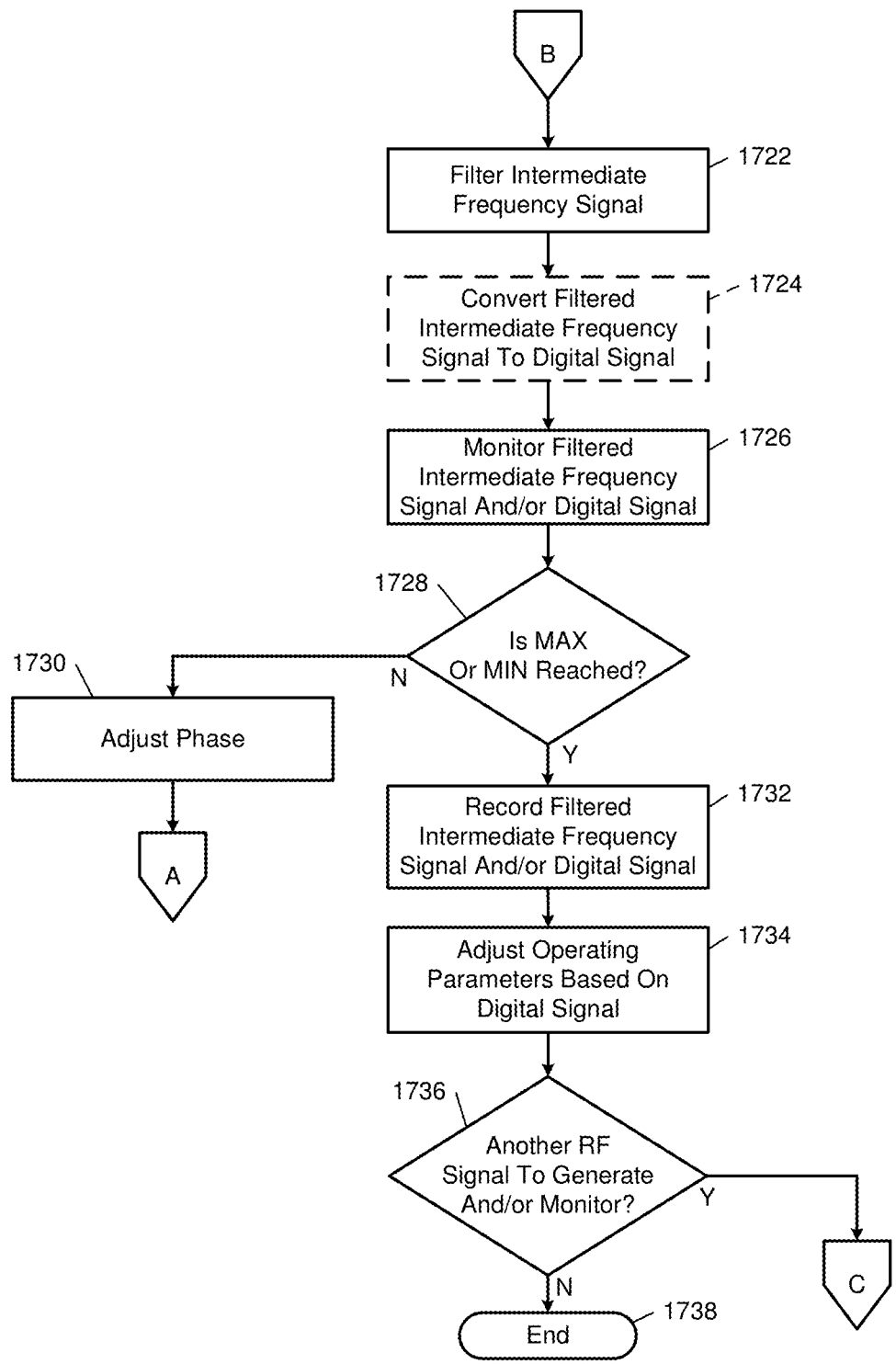

The systems disclosed herein may be operated using numerous methods, an example method is illustrated in FIG. 17. In FIG. 17, a method of operating an RF control circuit is shown. Although the following operations are primarily described with respect to the implementations of FIGS. 1 and 4-16, the operations may be easily modified to apply to other implementations of the present disclosure. The operations may be iteratively performed. Although the following operations are described with respect to monitoring a single RF frequency at a time, any number of RF frequencies may be monitored during a same period of time. A controller (e.g., one of the controllers disclosed herein), may time multiplex through iteratively selecting multiple frequencies, where each of the frequencies is monitored during respective time slots within a predetermined period. In one embodiment, certain frequencies are provided with longer and/or more time slots than other frequencies.

The method may begin at 1700. At 1702, the controller may determine recipe parameters and/or current operating parameters for a plasma processing system. This may include RF voltages, frequencies, phases, pulse widths, amplitude and/or frequency modulation parameters, pulsing parameters, gas and mixture compositions, operating temperatures including component temperatures and gas temperatures, gas pressures, etc.

At 1704, the controller, a system operator, a DDS chip, or other device may select a frequency $\omega_{LO}$ to monitor. This may be accomplished by adjusting an external LO clock. After setting this, equation 1 becomes equation 12 below. In one embodiment, the user sets a particular frequency for example $\omega_{LO} = \omega_{RF1}$. An auto-frequency tuning word may be programmed within the DDS chip to reduce and/or prevent frequency errors.

At 1706, the controller, a system operator, a DDs chip, or other device may select a starting phase based on the recipe parameters, the current operating parameters, and/or the selected frequency. The controller, a system operator, a DDS chip, or other device may tune $\phi_{LO}$ until the RF sensor reading is either a maximum or a minimum ($\cos(0)=1$ or $\cos(180)=-1$). The starting phase may be based on historical values stored in a memory of the controller. The phase $\phi_{RF}$ is typically unknown as it relates to the phase shift through the plasma processing system and corresponding plasma effect, the phase $\phi_{LO}$ is tuned. This may be accomplished by monitoring a cosine error function of $\cos[(\phi_{RF} - \phi_{LO})]$ for a maximum $\cos(0)=1$ or a minimum $\cos(180)=-1$ providing a simple search algorithm. The difficulty in implementing this metrology approach on etch tools comes from difficulty at the system level with RF generator and RF sensor relationships.

Summary of Issues

The first issue arises in programming $\omega_{LO} = \omega_{RF}$. If these two frequencies are not exactly the same, then the RF sensor downconverts the RF signal of interest to a lower beat frequency and not to a direct current (DC) signal as intended. Generating a reference LO signal of exactly a same frequency is difficult, if a same time-base is not used. In etch systems with RF generators with auto-frequency tuning (AFT), the RF frequency is changing rapidly and frequently. Hence programming $\omega_{LO}$ can be problematic. In addition, with interest in harmonics and intermods, the ability to program harmonics (e.g., $2\omega_{RF}$, $3\omega_{RF}$, etc.) or intermods (e.g., $\omega_{RF1} +/- \omega_{RF2}$) becomes challenging since an exact frequency is needed and these frequencies are rapidly changing due to AFT. Fundamental understanding of how phase of the RF signal shifts as the generator is operating under AFT is necessary since the following dependency $V_{IF} = 0.5 * k * V_{RF} * \cos[(\phi_{RF} - \phi_{LO})]$ holds true. Since the RF control circuit is aiming for $\phi_{RF} - \phi_{LO} = 0$, if the phase $\phi_{RF}$ is not steady or controlled along with $\phi_{LO}$, then the RF sensor is simply tracing out a cosine function as $\phi_{LO}$ is swept.

A second issue can arise when it is assumed that $V_{LO} = k$; a constant regardless of frequency. If high frequencies are monitored, this assumption may not hold true because there will be frequency dependence making the voltage amplitude or $V_{LO}$ not constant. Thus, a problem solved by the examples disclosed herein is that of generating a programmable clock over a wide frequency-dynamic range (e.g. 1 MHz to 100 MHz) and providing $V_{LO}$ without much change in amplitude. To be effective, the RF sensor should have better than 1% accuracy, and if $V_{LO}$ varies with frequency, then an error has been introduced.

A third issue refers to a need to measure RF signals over a wide range of frequencies while maintaining a constant amplitude in the detected RF signals. In addition, RF generators traditionally run on independent RF clock time-bases. Also, for pulse applications, the RF signals are asynchronous. Hence on multi-RF generator tools, the ability to measure the output of each RF generator individually and/or corresponding intermodulation frequencies can be difficult due to separate time-bases of the RF generators. This is referred to below as the fourth issue.

Solutions to Issues

For the first issue, a reference LO signal $V_{LO}$ may be generated for one or more RF generators and/or for multiple channels of each RF generator based on a same RF reference clock and thus originates from a same time-base as the RF signal itself. See, for example, the embodiments of FIGS. 13-14. The reference LO signals $V_{LO}$ may be generated by the RF generators. Each of the RF generators, as shown above may include a DDS chip, which may generate a reference LO signal $V_{LO}$.

As a functional description, the DDS chips may be used as a phase, frequency, and amplitude sine-wave generators to rapidly auto-frequency tune the frequency, phase and amplitude. The amplitude may be adjusted in power amplifiers rather than in the DDS chips. The DDS chips may have an input clock and an internal PLL to boost the effective DDS-clock. For example, a DDS chip may receive a 50 MHz reference clock and boost it by a multiple of 5, to run at an effective 250 MHz time-base. The DDS chips may be multi-channel chips, where the channels of one or more of the chips reference a same time-base. Because registers of the channels of a DDS chip are updated on a same clock-cycle, compatibility with AFT is easy accomplished by updating the reference LO signal $V_{LO}$ channel synchronously when the corresponding RF channel is changed.

Hence solving issues with precise and/or exact frequency accuracy may include using a spare channel of a DDS chip within a RF generator to provide the reference LO signal $V_{LO}$. This allows the reference LO signal $V_{LO}$ to come from a same time-base eliminating potential frequency errors (whatever frequency error exists is coherent to each of the channels within the DDS chip; hence the RF and LO signals have the same error).

To solve the second issue, a limiter may be introduced in the LO path to square up the reference LO signal $V_{LO}$. See, for example, the embodiment of FIG. 4. Although this provides a square wave in the time domain and a sinc wave in the frequency domain, this removes $V_{LO}$ amplitude variation as a function of frequency which is likely a more dominant error source.

To solve the third issue associated with measuring over a wide range of frequencies, a broadband divider is implemented, such as the voltage dividers of FIGS. 4-5 in order to measure over a wide range of frequencies while maintaining a constant amplitude. This can be done for both voltage and current. The detected RF voltages are divided down based on a predetermined ratios (e.g., 1/1000) and provide a flat amplitude response for a wide range of frequencies including frequencies of interest. The voltage divider is likely implemented in a high-voltage/high-current environment converting RF signals to a tolerable level and the resultant signal is then fed to an input of a lock-in RF sensor.

The fourth issue may be solved using multiple techniques. As a first example, a hardware switch (e.g., the switch 814 of FIG. 8) may be used to multiplex between different reference LO signals provided by each RF generator individually. As a second example, RF generators may be operated based on a synchronous time-base, as described with respect to FIG. 14 via RefSync. RefSync may be provided from RF generator to RF generator or distributed to the RF generators to synchronize the reference clocks of the internal DDS chips of the RF generators, such that the DDS chips operate based on a same frequency time-base. If each of the RF generators operates at a multiple of the reference clock signal (e.g., 4× RefSync), then the RF generators operates off the same frequency time-base. This introduces an issue with clock phase synchronicity between the DDS chips, since the multiple (e.g., 4×) boost can result in a 0-N (e.g., 0, 1, 2, or 3) cycle clock error. To synchronize the phase of the DDS chips, a PLL synchronization or phase synchronization signal may be transmitted between the DDS chips. This locks phase timing of the DDS chips as well as increasing ease in tuning the reference LO signal $\phi_{LO}$.

In an embodiment and prior to or during operations 1704 and 1706, the frequency $\omega_{LO}$, the phase $\phi_{LO}$ may be programmed. Equation 8 may be satisfied when the frequency $\omega_{LO}$ is programmed. Equation 9 may be satisfied after one or more iterations of the operations of 1706, 1708, 1710, 1712, 1714, 1716, 1718, 1720, 1722, 1724, 1726, 1728, and 1730. Equation 10 is also satisfied.

$$\omega_{RF} = \omega_{LO} \tag{8}$$

$$\phi_{RF} - \phi_{LO} = \Delta\phi = 0 \tag{9}$$

$$V_{LO} = k, \text{constant} \tag{10}$$

During the operations 1706 and 1730, the phase $\phi_{LO}$ is swept for a MAX or MIN amplitude and/or a MAX or MIN phase error, such that $$V_{IF} = \frac{1}{2} k V_{RF}.$$

After setting $V_{LO}$ equal to k and filtering to remove higher order terms, equation 1 becomes equation 11.

$$V_{IF} = \frac{1}{2} k V_{RF} \cos[(\omega_{RF} - \omega_{LO})t - (\phi_{RF} - \phi_{LO})] \tag{11}$$

After setting the $\omega_{LO}$ equal to $\omega_{RF}$, equation 11 becomes equation 12.

$$V_{IF} = \frac{1}{2} k V_{RF} \cos[(\phi_{RF} - \phi_{LO})] \tag{12}$$

At 1708, a first reference LO signal $V_{LO1}$ is received at a RF sensor (e.g., any one of the RF sensors disclosed herein). At 1710, the received first reference LO signal $V_{LO1}$ is buffered via a first buffer. At 1712, a sine wave out of the first buffer may be converted to a square wave via a sine-to-square wave converter. At 1714, a current level of the square wave signal (or local oscillator signal) may be increased via a current boost circuit to provide a second reference LO signal $V_{LO2}$, which is the reference locking signal that may be selected, supplied and/or programmed using the example RF sensor configurations disclosed herein.

At 1716, the RF input voltage signal $V_{RF}$ is detected and received at a voltage divider, which divides the voltage of the RF input voltage signal $V_{RF}$ by a predetermined amount. The divider is a high-voltage/high-current divider and transforms a raw signal from a measurement point to low-voltage levels with minimal frequency error/distortion. The RF input voltage signal $V_{RF}$ may have noise and/or additional frequencies riding on top of a signal of interest. At 1718, an output of the voltage divider is buffered via a second buffer.

At 1720, an intermediate frequency signal $V_{IF}$ is generated via a mixer (e.g., one of the DBMs described herein or a linear mixer) based on the second reference LO signal $V_{LO2}$ and the RF input voltage signal $V_{RF}$. At 1722, the intermediate frequency signal $V_{IF}$ may be filtered by a low pass filter to reduce high-order frequency components. This may be done to remove higher order terms, such as 2ω.

At 1724, the filtered intermediate frequency signal $V_{IF}$ may be converted to a digital signal. At 1726, the controller monitors the filtered intermediate frequency signal $V_{IF}$ and/or the digital signal.

The following operations 1728 and 1730 may be performed if, for example, the configuration of FIG. 14 or the like is not implemented and there is potential for phase error between the generated RF signal $V_{RF}$ and the reference LO signal $V_{LO}$. At 1728, the controller may determine if a MAX or MIN has been reached. The MAX and MIN may refer to a maximum or minimum voltage of the detected RF input voltage signal $V_{RF}$ and/or a maximum or minimum voltage of the filtered intermediate frequency signal $V_{IF}$ and/or the digital signal, which may refer to $V_{RF}$ in equation 11. As an alternative, the MAX or MIN may refer to a maximum or minimum phase error (or difference between a phase $\phi_{RF}$ of a RF signal generated and provided to a plasma processing chamber and a phase $\phi_{LO}$ of the reference LO signal $V_{LO}$. In an embodiment, the system operator either monitors and/or performs closed-loop control of the reference LO signal $V_{LO}$ by adjusting a generator setpoint, an impedance of a match network, and/or other parameter via one or more system knobs. As a result of the stated programming and phase adjustments described, equation 12 is simplified to equation 13.

$$V_{IF} = \frac{1}{2}kV_{RF} \tag{13}$$

If the MAX or the MIN has not been reached, then operation 1730 is performed, otherwise operation 1732 is performed. At 1730, the phase of the generated reference LO signal $V_{LO}$ is adjusted to decrease the phase error.

At 1732, the controller may record the filtered intermediate frequency signal $V_{IF}$ and/or the digital signal. At 1734, the controller may adjust the recipe and/or operating parameters based on the filtered intermediate frequency signal $V_{IF}$ and/or the digital signal.

At 1736, the controller may determine whether there is another RF signal to be generated and/or monitored. For example, the controller, DDS, RF generator, system operator, etc. may monitor a different frequency, harmonic frequency, and/or intermodulation frequency. If an intermodulation frequency is to be monitored, as an example, the reference LO signal frequency $\omega_{LO}$ may be set equal to a current RF frequency $\omega_{RF1}$ plus and/or minus another frequency (e.g., a second RF frequency $\omega_{RF2}$). If there is another RF signal to be generated and/or monitored, operation 1702 may be performed, otherwise the method may end at 1738.

The above-described operations are meant to be illustrative examples; the operations may be performed sequentially, synchronously, simultaneously, continuously, during overlapping time periods or in a different order depending upon the application. Also, any of the operations may not be performed or skipped depending on the implementation and/or sequence of events.

If multiple frequencies are desired to be monitored simultaneously, multiple channels may be monitored in parallel. If simultaneous measurement is not needed, then one RF sensor may be used to monitor multiple frequencies by only changing $\omega_{LO}$ via a switch or a multiplexer as described above.

If the corresponding RF control circuit has multiple broadband dividers located at different nodes within a high-voltage/high-current RF environment, with the addition of an input selection multiplexer, various nodes in the plasma processing system may be monitored. The nodes may refer to various connection points in the plasma processing system. The voltage dividers may receive RF signals from the nodes, which may then be provided to the multiplexer. The controller may signal the multiplexer to select one of the RF signals to monitor.

The RF sensors disclosed herein are highly linear, which allows the corresponding calibration of the RF sensors to be performed similar as the self-locking RF sensors disclosed in U.S. Pat. No. 9,805,919 and/or FIGS. 1-2. This may include: a) two wide calibration points that that may be spaced to the edge of dynamic range limits (high and low) to maximize a dynamic range at the trade-off of linearity and accuracy; b) two nearby calibration points that may be selected for good linearity and accuracy in a smaller window, at the trade-off of dynamic range; c) piece-wise linear calibration that may be done by picking a variety of GAIN and OFFSET calibration values to provide a balanced trade-off between both dynamic range and accuracy; and d) other more complex software-based calibration approaches may be applied for improved accuracy. In one embodiment, calibration is not needed.

The embodiments disclosed herein provide RF control circuits with highly accurate linear RF sensors having a wide dynamic range. The RF sensors are able to be used to select and lock onto various frequencies. The RF sensors and corresponding lock-in amplifiers provide the ability to accurately measure and characterize metrology signals in the presence of other corrupting signals (e.g., noise). The examples include same time-base RF delivery systems with multiple generators for RF metrology accuracy. The RF control circuits and sensors are able to measure and characterize multi-frequency environments, harmonics, intermods, etc. The examples further provide the ability to measure intermodulation products between generators and plasma. The RF sensors may be inexpensive with minimal programming and/or processing power needed.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from multiple fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A radio frequency control circuit comprising:
   a controller configured to select a reference frequency, wherein the reference frequency is a frequency of a first reference local oscillator signal;
   a divider configured to receive a first radio frequency signal detected in a substrate processing chamber and divide the first radio frequency signal to output a second radio frequency signal, wherein the first radio frequency signal is generated by a first radio frequency generator and supplied to the substrate processing chamber; and
   a first radio frequency sensor comprising a lock-in amplifier, wherein the lock-in amplifier comprises
      a radio frequency path configured to receive the second radio frequency signal,
      a local oscillator path configured to receive the first reference local oscillator signal generated by the first radio frequency generator or the controller,
      a first mixer configured to generate a first intermediate frequency signal based on the second radio frequency signal and the first reference local oscillator signal, and
      a filter configured to filter the first intermediate frequency signal,
   wherein the controller is configured to generate a control signal based on the filtered first intermediate frequency signal and transmit the control signal to the first radio frequency generator to adjust the first radio frequency signal.

2. The radio frequency control circuit of claim 1, further comprising at least one of:
 a sine-to-square wave converter configured to convert a sine wave of the second radio frequency signal to a square wave; or
 a current amplifier configured to amplify an output of the sine-to-square wave converter,
 wherein the output of the sine-to-square wave converter is provided to the first mixer.

3. The radio frequency control circuit of claim 1, wherein the reference frequency is a harmonic of a frequency of the first radio frequency signal or is an intermodulation frequency corresponding to the first radio frequency signal.

4. The radio frequency control circuit of claim 1, wherein the local oscillator path is configured to receive the first reference local oscillator signal from the first radio frequency generator or the controller.

5. The radio frequency control circuit of claim 1, wherein the first radio frequency signal is detected at least one of at an output of a match network or at a point within the substrate processing chamber.

6. The radio frequency control circuit of claim 1, wherein the first radio frequency generator is configured to generate the first reference local oscillator signal.

7. The radio frequency control circuit of claim 1, wherein the controller is configured to generate the first reference local oscillator signal.

8. The radio frequency control circuit of claim 1, wherein:
 the first radio frequency generator or the controller is configured to sweep a phase of the first reference local oscillator signal until a maximum or a minimum is reached;
 the maximum is a maximum voltage of the first radio frequency signal or a maximum phase error between a phase of the first radio frequency signal and a phase of the first reference local oscillator signal; and
 the minimum is a minimum voltage of the first radio frequency signal or a minimum phase error between a phase of the first radio frequency signal and a phase of the first reference local oscillator signal.

9. A processing system comprising:
 the radio frequency control circuit of claim 1; and
 a match network,
 wherein
  the controller comprises a first channel, a second channel and a third channel,
  the first channel outputs a third radio frequency signal,
  the second channel outputs a fourth radio frequency signal,
  the third channel outputs the first reference local oscillator signal to the first radio frequency sensor,
  the first radio frequency generator comprises a first power amplifier and a second power amplifier,
  the first power amplifier is configured to generate the first radio frequency signal based on the third radio frequency signal,
  the second power amplifier is configured to generate a fifth radio frequency signal based on the fourth radio frequency signal, and
  the match network is configured to receive the first radio frequency signal and the fifth radio frequency signal.

10. A processing system comprising:
 the radio frequency control circuit of claim 1; and
 a match network configured to receive the first radio frequency signal,
 wherein
  the first radio frequency generator comprises a first channel and a second channel,
  the first radio frequency signal is generated based on an output of the first channel,
  the second channel is configured to output the first reference local oscillator signal,
  the first radio frequency sensor comprises
   a second mixer configured to generate a second intermediate frequency signal based on an output of the match network, wherein the first mixer is configured to generate the first intermediate frequency signal based on the first reference local oscillator signal, and
   a phase shifter configured to phase shift the first reference local oscillator signal,
  the second mixer is configured to generate the second intermediate frequency signal based on the phase shifted first reference local oscillator signal,
  an output of the first radio frequency sensor is generated based on the second intermediate frequency signal, and
  the controller is configured to generate the control signal to control the first radio frequency generator based on the output of the first radio frequency sensor.

11. A processing system comprising:
 the radio frequency control circuit of claim 1; and
 the first radio frequency generator configured to, based on a radio frequency of the first radio frequency signal, output the first reference local oscillator signal.

12. The processing system of claim 11, wherein:
 the first radio frequency generator comprises a plurality of channels including a first channel and a second channel;
 the first radio frequency signal is generated based on an output of the first channel; and
 the first reference local oscillator signal is generated based on an output of the second channel.

13. The processing system of claim 12, wherein the first radio frequency generator is configured to generate the first radio frequency signal and the first reference local oscillator signal based on a reference clock signal.

14. The processing system of claim 12, wherein:
 the plurality of channels comprise a third channel;
 the third channel is configured to output a third radio frequency signal for the substrate processing chamber; and
 the first radio frequency generator is configured to generate the first radio frequency signal and the third radio frequency signal based on a reference clock signal.

15. The processing system of claim 14, wherein:
 the first radio frequency generator outputs the first radio frequency signal and a fourth radio frequency signal to a match network; and
 the fourth radio frequency signal is generated based on the third radio frequency signal.

16. The processing system of claim 12, further comprising:
 a match network; and
 a second radio frequency generator configured to generate a third radio frequency signal,
 wherein the match network is configured to receive the first radio frequency signal and the third radio frequency signal.

17. The processing system of claim 16, wherein:
the first radio frequency generator is configured to generate the first radio frequency signal based on a reference clock signal; and
the second radio frequency generator is configured to generate the third radio frequency signal based on the reference clock signal.

18. The processing system of claim 16, wherein:
a phase synchronization signal is transmitted between the first radio frequency generator and the second radio frequency generator; and
the first radio frequency generator adjusts a phase of the first radio frequency signal based on the phase synchronization signal or the second radio frequency generator adjusts a phase of the third radio frequency signal based on the phase synchronization signal.

19. The processing system of claim 16, further comprising a switch or a multiplexer, wherein:
the second radio frequency generator is configured to output a second reference local oscillator signal;
the controller is configured to control operation of the switch or multiplexer to select one of the first reference local oscillator signal and the second reference local oscillator signal; and
the local oscillator path is configured to receive the selected one of the first reference local oscillator signal and the second reference local oscillator signal.

20. The processing system of claim 16, further comprising a second radio frequency sensor, wherein:
the second radio frequency generator is configured to output a second reference local oscillator signal; and
the second radio frequency sensor is configured to receive the second radio frequency signal and the second reference local oscillator signal.

\* \* \* \* \*